United States Patent [19]

Iwai et al.

[11] Patent Number: 5,483,490
[45] Date of Patent: Jan. 9, 1996

[54] SEMICONDUCTOR INTEGRATED DEVICE AND WIRING CORRECTION ARRANGEMENT THEREFOR

[75] Inventors: Hidetoshi Iwai, Ohme; Masamichi Ishihara; Kazuya Ito, both of Hamura; Wataru Arakawa, Ohme; Yoshinobu Nakagome, Hachioji, all of Japan

[73] Assignee: Hitachi, Ltd., Tokyo, Japan

[21] Appl. No.: 159,619

[22] Filed: Dec. 1, 1993

Related U.S. Application Data

[63] Continuation of Ser. No. 820,489, Jan. 14, 1992, Pat. No. 5,289,416.

[30] Foreign Application Priority Data

Jan. 14, 1991 [JP] Japan .................................. 3-014746

[51] Int. Cl.⁶ .................................................. G11C 13/00
[52] U.S. Cl. ...................................... 365/200; 365/189.01
[58] Field of Search ................................ 365/200, 189.01, 365/189.04, 189.08, 230.01, 230.03

[56] References Cited

U.S. PATENT DOCUMENTS 4,872,140 10/1989 Graham et al. ........................ 365/225.7
4,969,124 11/1990 Luich et al. ........................... 365/225.7

Primary Examiner—Terrell W. Fears
Attorney, Agent, or Firm—Antonelli, Terry, Stout & Kraus

[57] ABSTRACT

An arrangement is provided for preventing DC defects in a memory or logic device after switching to a redundant circuit, improving the product yield of the device by cutting a leakage current path through a defective element or circuit. The cutting points formed by the predetermined wirings as a whole or a part thereof are provided to the device. A probe test of the formed chip is executed under the wafer condition by predetermined test equipment, and wiring correction data regarding the cutting of the cutting points is generated based on the result of test. Moreover, this wiring correction data is transmitted in an on-line fashion to the wiring correction equipment so that the corresponding cutting points can be cut. The wiring correction equipment can be formed by an EB direct writing apparatus, an FIB apparatus or a laser repair apparatus. With this arrangement, the leakage current path formed by a defective element or circuit left unused in conventional circuits is cut, and the product yield of the device is raised significantly. This arrangement can be used for a variety of memory or logic devices, including DRAMs, SRAMs, multiport memories and gate arrays.

13 Claims, 23 Drawing Sheets

SEMICONDUCTOR INTEGRATED DEVICE AND WIRING CORRECTION ARRANGEMENT THEREFOR

This is a continuation of application Ser. No. 820,489, filed Jan 14, 1992 U.S. Pat No. 5,289,416.

BACKGROUND OF THE INVENTION

The present invention relates to a semiconductor integrated circuit device and wiring correction equipment, and, more specifically, to technology which is particularly effective for a dynamic RAM (Random Access Memory) having a defect saving function, and wiring correction equipment thereof.

There has been proposed a dynamic RAM which is basically formed by a memory array consisting of a plurality of orthogonally crossing word lines and bit lines and dynamic memory cells being arranged, in the form of a lattice, at the intersecting points of these word lines and bit lines. As a method of enhancing product yield of these dynamic RAMs, the so-called "defect saving system" has been proposed, in which redundant word lines and redundant bit lines are provided for the memory array. These redundant elements are used to replace defective word lines or defective bit lines selectively. Accordingly, a number of dynamic RAMs are now provided with such defect saving systems. One example of such a dynamic RAM having a defect saving system has been described, for example, in an article in NIKKEI ELECTRONICS, pp. 209–231, Jun. 3, 1985, issued by Nikkei McGraw-Hill.

In a conventional dynamic RAM providing the defect saving system as explained above, the defective word lines and defective bit lines which are replaced with the redundant word lines or redundant bit lines are left connected with the memory array. From their studies the inventors have found that if a current leak path is formed, for example, via the common source line and bit line precharge circuits and defective word lines or defective bit lines of these circuits, such a chip will be considered as a defective product in the DC state because it will have a defective stand-by current and a defective plate level, although the chip is quite normal in its ordinary operating function. As a result of this, the saving rate of the dynamic RAM cannot be improved as much as expected even though it has the defect saving function. This creates a problem that the expected improvement for realizing low cost has been restricted.

Meanwhile, a conventional dynamic RAM providing such a defect saving function is typically provided with a plurality of defective address ROMs. These defective address ROMs are provided corresponding to redundant word lines or redundant bit lines to store defective addresses assigned to corresponding redundant word lines or redundant bit lines. The defective address ROMs include a plurality of fuse means which are cut in a predetermined combination, and a plurality of address comparison circuits which compare and collate, bit by bit, the known defective addresses with addresses supplied at the time of memory access, and which select the corresponding redundant word lines or redundant bit lines when these addresses are matched. When a dynamic RAM tends to have larger capacity, the number of bits of address signal also increases and thereby the number of required fuse means also increases, resulting in an increase of required layout area of the defective address ROM and address comparison circuit. Moreover, the number of logical stages of the address comparison circuit, etc. increases, and a comparatively longer time is required for the redundant word lines or redundant bit lines to be selected from the start of dynamic RAM. As a result, a problem is created that the chip area of dynamic RAMs having the defect saving function increases, so that the desired improvement for low cost is interfered with and the access time is delayed.

OBJECTS OF THE INVENTION

It is therefore one object of the present invention to provide a means for easily separating a defective element or circuit which has been replaced by a redundant element or circuit.

Another object of the present invention is to suppress generation of DC failure after saving a defect to enhance product yield of a dynamic RAM having the defect saving function.

A further object of the present invention is to provide a means for switching a defective element or circuit to a redundant element or circuit without increasing the required layout area or sacrificing access time.

Yet another object of the present invention is to reduce the chip area to accelerate realization of low cost without deteriorating high speed characteristics of a dynamic RAM having the defect saving function.

A further object of the present invention is to provide a means for easily cutting or connecting the predetermined wirings formed on a semiconductor substrate.

Another object of the present invention is to provide various application examples of use of a means for cutting and connecting wirings.

SUMMARY OF THE INVENTION

To accomplish these and other objects, a function test of a chip forming a dynamic RAM (or another type of memory such as a multi-port RAM, a static RAM, etc., or a logic integrated circuit such as a gate array, etc.), is executed under the wafer condition by predetermined test equipment, and the result of the test is transmitted as wiring correction data on an on-line basis to the wiring correction equipment which is basically formed by the EB direct wiring apparatus or FIB apparatus or laser repair apparatus. The defective element or circuit is replaced with a redundant element or circuit by cutting or connecting directly or indirectly the corresponding wirings on the chip based on the wiring correction data, and, moreover, the current path formed through these defective elements or circuits is cut. In addition, cutting and connection of these wirings are also applied for separation of a defective part of a partial product and selection of operation characteristic or product specification of a predetermined internal circuit.

According to a means explained above, a defective element or circuit is replaced by a redundant element or circuit without increasing the predetermined layout area or sacrificing the access time of the dynamic RAM or other memory or logic circuitry. Also, the defective element or circuit which is replaced with a redundant element or circuit is effectively separated from the rest of the memory elements, and a leak current path formed through these defective elements or circuits can be cut. Moreover, low power consumption can be accelerated by effectively separating a defective part of a partial product and operation characteristics and product specifications of the internal circuitry of a dynamic RAM can be changed without providing a fuse or some similar device. As a result, DC failure after selection of a redundant element of the dynamic RAM having a defect saving function can be prevented, and product yield can also be enhanced. Moreover, chip area, operation current and test steps can be reduced, and improvement for realizing low cost and low power consumption can be accelerated without deteriorating high speed characteristics of a dynamic RAM or other memory or logic circuitry.

DETAILED DESCRIPTION

1. Block Composition of dynamic RAM

Figure 1:
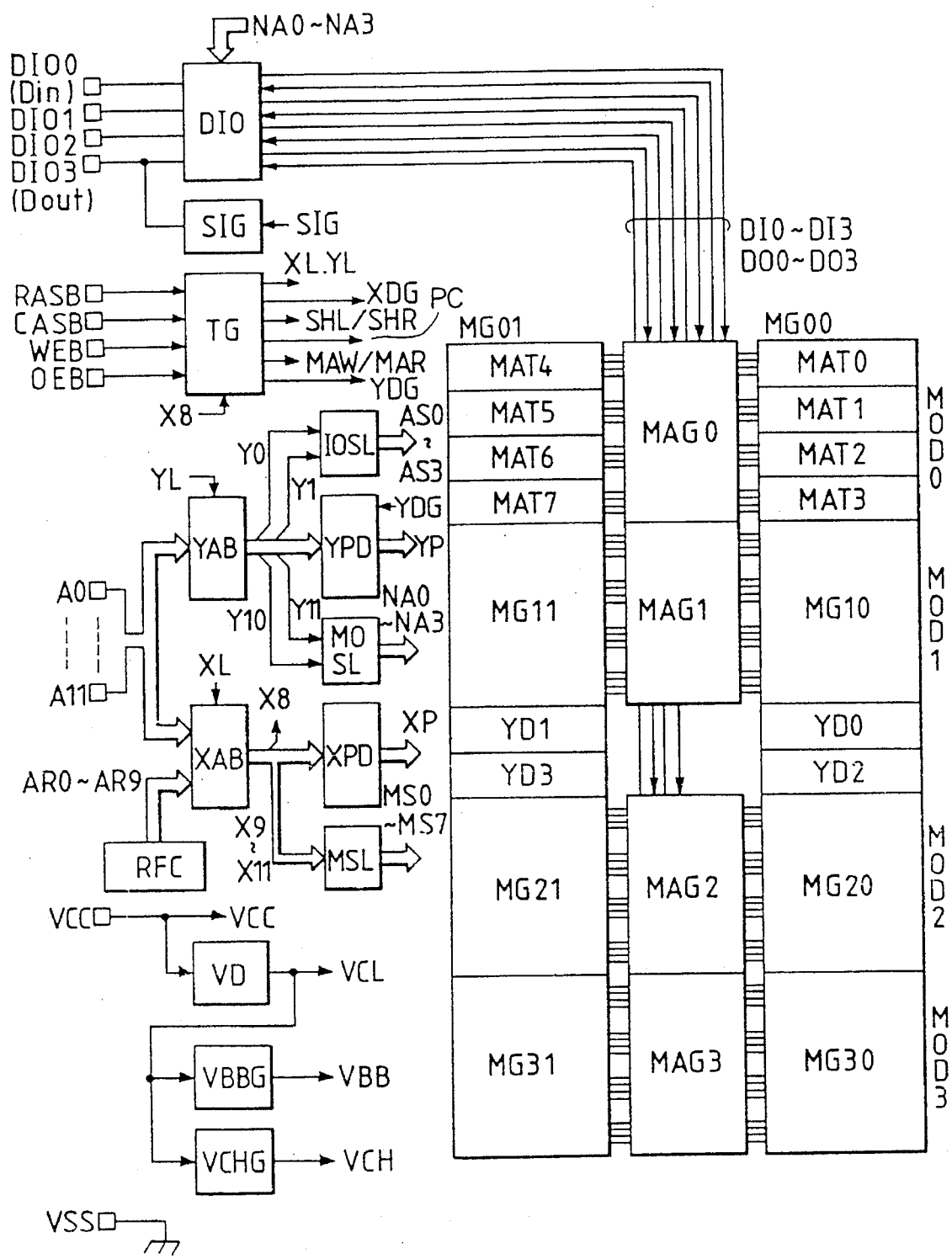
FIG. 1 is a block diagram indicating an embodiment of a dynamic RAM to which the present invention is applied.
Figure 2:
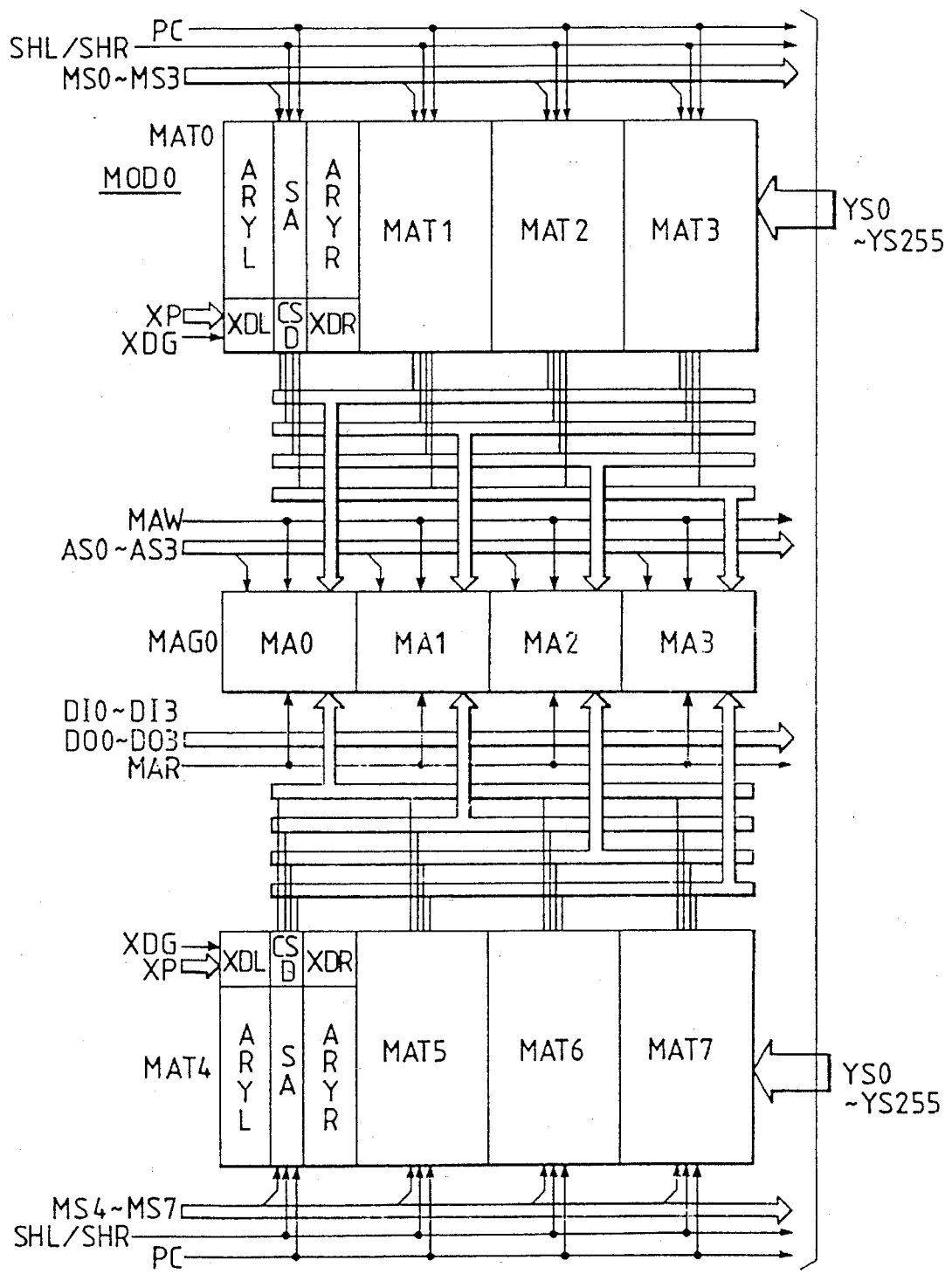
FIG. 2 is a block diagram indicating an embodiment of a memory module included in the dynamic RAM of FIG. 1.

FIG. 1 is a block diagram of an embodiment of a dynamic RAM to which the present invention is applied. Moreover, FIG. 2 is a block diagram of an embodiment of a memory module MOD0 included in a dynamic RAM. An outline of composition and operation of a dynamic RAM of the present invention will be explained hereunder. Circuit elements of each block of FIG. 1 and FIG. 2 are, unless otherwise restricted particularly, formed on a single semiconductor substrate such as a single crystal silicon.

In FIG. 1, a dynamic RAM of this embodiment is basically formed, although not restricted particularly, by four memory modules MOD0 MOD3 arranged occupying a greater part of the semiconductor substrate area. These memory modules are respectively provided with a main amplifier group MAG0 MAG3 and a total of eight memory mats MAT0 MAT7 in which four mats are respectively arranged in both sides of this main amplifier group, although not restricted particularly, as representatively shown by the memory module MOD0. Moreover, although not restricted particularly, four memory mats MAT0~MAT3 arranged in the right side of the main amplifier groups MAG0~MAG3 are respectively grouped as the memory mat groups MG00~MG03, while four memory mats MAT4~MAT7 arranged in the left side are respectively grouped as the memory mat groups MG01~MG31.

Here, the memory mats MAT0~MAT7 forming memory modules MOD0~MOD3 respectively comprise, although not restricted particularly, a pair of memory array ARYL and ARYR arranged in both sides of a sense amplifier SA, a pair of X address decoders XDL and XDR arranged corresponding to these memory arrays and a sense amplifier drive circuit CSD provided corresponding to the sense amplifier SA, as shown representatively by the memory mats MAT0~MAT4 of FIG. 2. An internal control signal XDG is supplied, although not restricted particularly, from a timing generating circuit TG to the X address decoders XDL and XDR and moreover a predetermined predecode signal XP is also supplied from the X predecoder XPD explained later. Moreover, internal control signals SHL, SHR and PC are supplied, although not restricted particularly, to the sense amplifier SA and sense amplifier drive circuit CSD from the timing generating circuit TG and the corresponding memory mat selection signals MS0~MS7 are also respectively supplied from the memory mat selection circuit MSL. The sense amplifier SA of the memory mats MAT0~MAT7 is respectively coupled with four main amplifiers MA0~MA3 forming the main amplifier group MAG0~MAG3 through four pairs of common I/O lines.

The main amplifer groups MAG0~MAG3 respectively include, although not restricted particularly, four main amplifiers as representatively shown by the main amplifier group MAG0 of FIG. 2. The internal control signals MAW and MAR are supplied in common, although not restricted particularly, to these main amplifiers from the timing generating circuit TG and the corresponding common I/O selection signals AS0~AS3 are also supplied respectively from the common I/O selection circuit IOSL. The main amplifiers MA0~MA3 are further coupled with a data input/output circuit DIO through the corresponding data input signal lines DI0~DI3 and data output signal lines DO0~DO3.

In this embodiment, the memory arrays ARYL and ARYR forming the memory mats MAT0~MAT7 respectively have, although not restricted particularly, memory capacity of so-called 256 Kbits as explained later. Therefore, the memory mats MAT0~MAT7 respectively have memory capacity of so-called 512 Kbits and memory modules MOD0~MOD3 respectively have memory capacity of so-called 4 Mbits. As a result, a dynamic RAM of the present invention has memory capacity of so-called 16 Mbits.

On the other hand, in the dynamic RAM of this embodiment, although not restricted particularly, one memory mat designated by the memory mat selection signals MS0~MS7 is selected respectively from eight memory mats MAT0~MAT7 forming each memory module, namely a total of four memory mats are selected therefrom simultaneously. In this case, as explained later, four memory cells are selected simultaneously in the selected memory mats and these memory cells are respectively coupled with the main amplifiers MA0~MA3 forming the corresponding main amplifier group through the corresponding complementary bit lines and four pairs of common I/O lines. These main amplifiers are operated one by one responsive to the common I/O line selecting signals AS0~AS3 and connected to the data input/output circuit DIO, for example, through the corresponding data input signal line DI0 or data output signal line DO0.

In addition, the dynamic RAM of this embodiment is selectively formed by so-called x1 bit or x4 bits composition, although not restricted particularly, by cutting of the predetermined wirings in the predetermined combination as will be explained later. When the dynamic RAM of the present invention is formed by the x1 bit composition, the data input/output circuit DIO selects only a pair of common I/O lines among four pairs responsive to the memory module selection signals NA0~NA3 and executes the read or write operation in a unit of one bit. In this case, the write data is inputted, although not restricted particularly, to the dynamic RAM through the data input/output terminal DIO0, namely data input terminal $D_{in}$, while the readout data is transmitted through the data input/output terminal DIO3, namely the data output terminal $D_{out}$.

Figure 3:
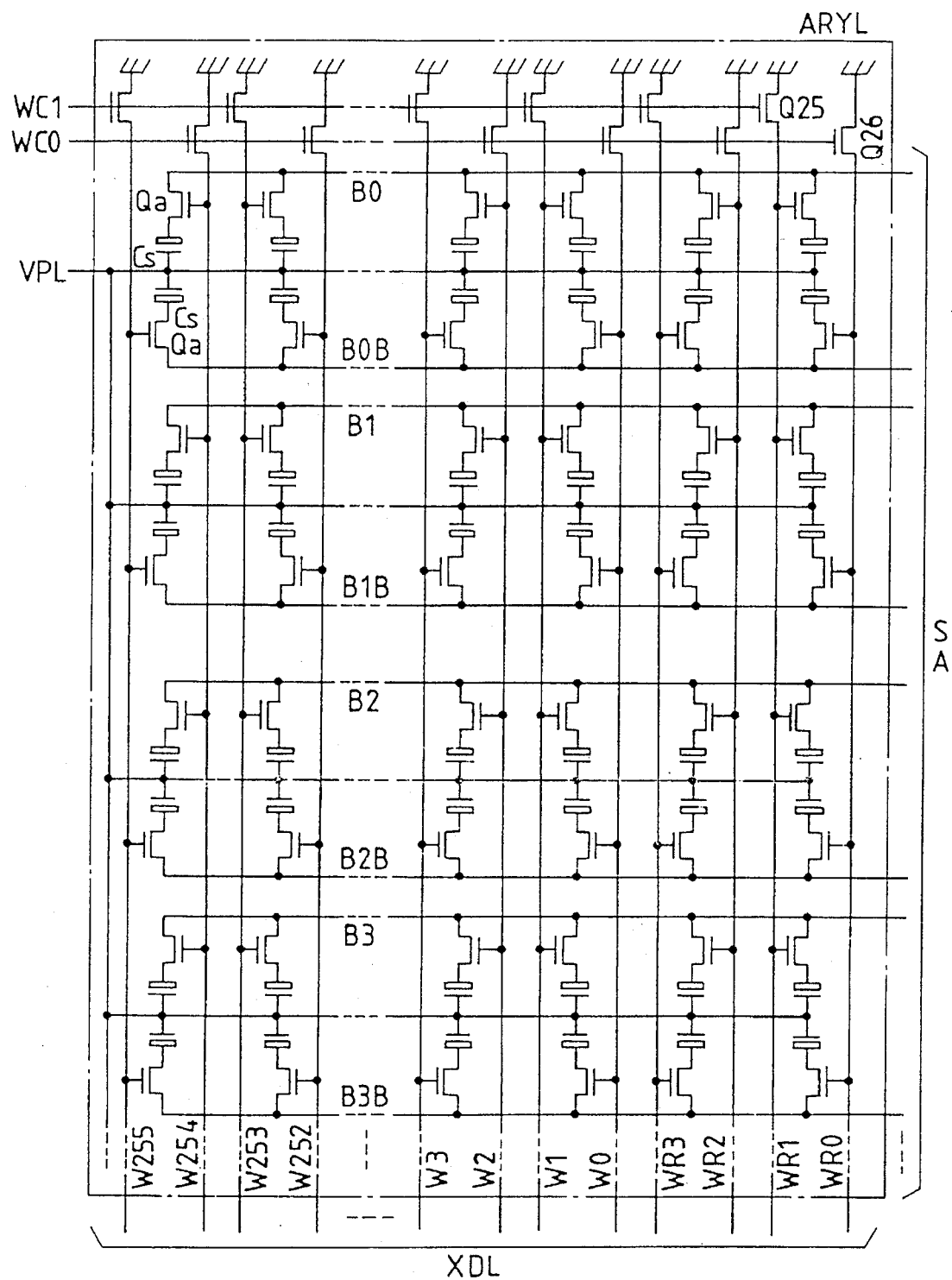
FIG. 3 is a partial circuit diagram of an embodiment of a memory array included in the memory module of FIG. 2.
Figure 4:
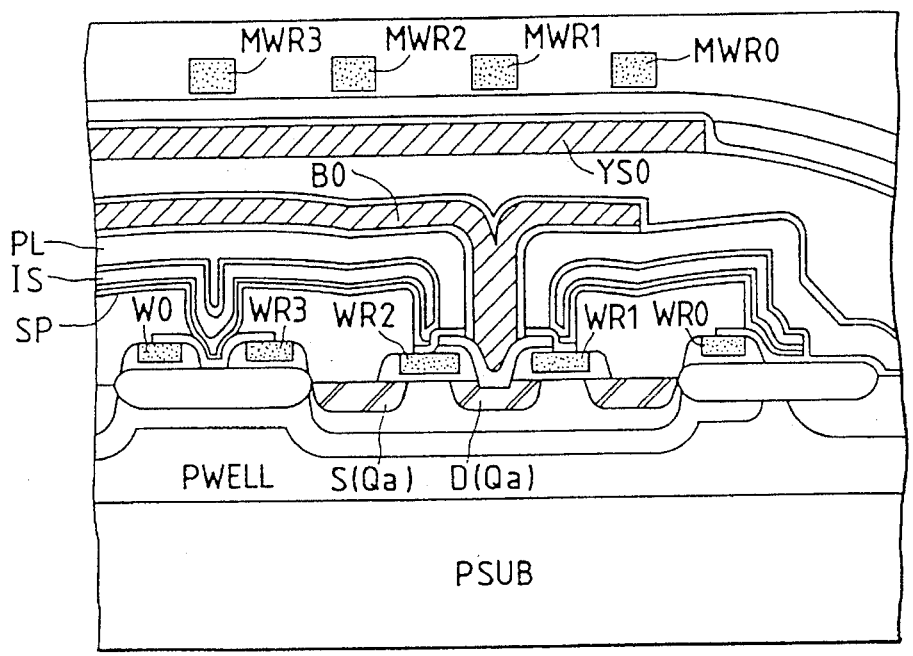
FIG. 4 is a partial sectional composition indicating an embodiment of the memory array of FIG. 3.
Figure 5:
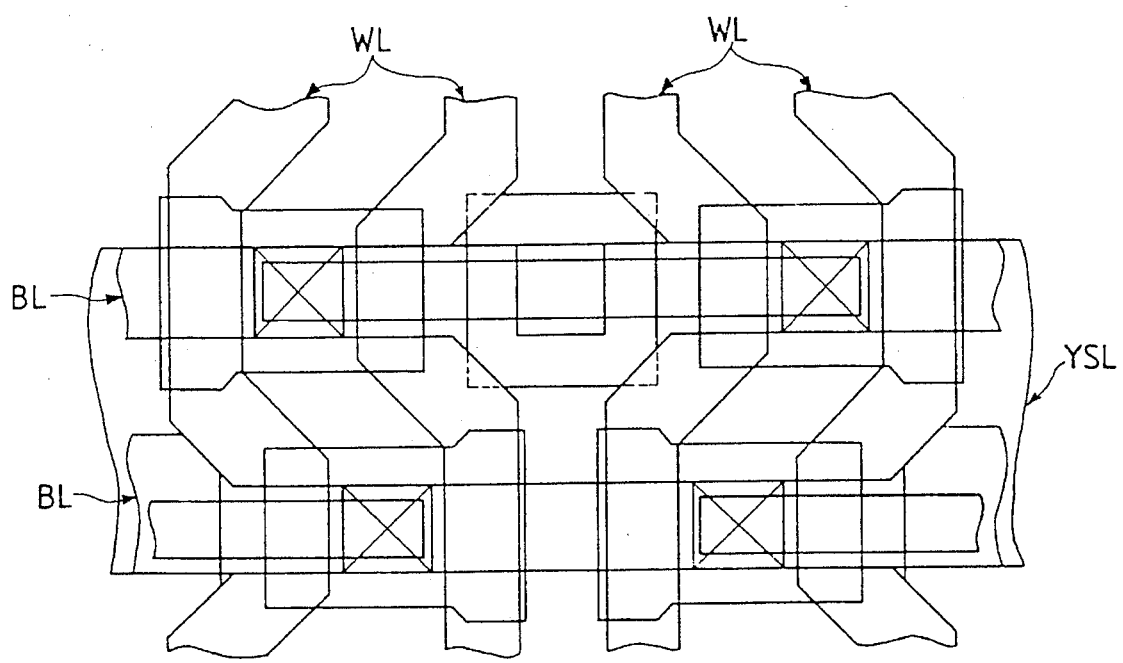
FIG. 5 is a partial plan composition indicating an embodiment of the memory array of FIG. 3.

2. Memory Array, Sense Amplifier, DC Defect Saving System and Method of Composing Partial Product 2.1 Memory Array FIG. 3 shows a circuit diagram of an embodiment of a memory array ARYL included in a memory mat MAT0 of memory module MOD0 of a dynamic RAM of FIG. 1 and FIG. 2. Moreover, FIG. 4 and FIG. 5 show a partial sectional structure and a partial plane structure of an embodiment of the memory array ARYL of FIG. 3. Outlines of practical composition and operation of the memory array forming the dynamic RAM of the present embodiment will be explained with reference to an example of this memory array ARYL. In the following circuit diagram, a MOSFET (Metal Oxide Semiconductor Field Effect Transistor, a general name of an insulated gate type field effect transistor in this specification) which has a channel (back gate) given an arrow mark is a P-channel type, while an N-channel MOSFET is not given the arrow mark.

In FIG. 3, a memory array ARYL includes, although not restricted particularly, 256 word lines W0~W255 arranged in parallel with the vertical direction of the figure, four redundant word lines WR0~WR3, 1024 pairs of complementary bit lines B0~B1023 (here, in the following explanation, for example, the non-inverted bit line B0 and inverted bit line B0B are combiningly indicated as complementary bit line B0 with the under line and moreover, the so-called inverted signal or inverted signal line which is selected set to a low level when it is effective is given the alphabet B at the final digit such as the inverted bit line B0B) which are arranged in parallel in the horizontal direction and eight pairs of redundant complementary bits lines BR0~BR7 (not shown). At the intersecting points of these word lines and redundant word lines, and these complementary bit lines and redundant complementary bit lines, total of 260×1032 dynamic memory cells are arranged in the form of a lattice. Thereby, the memory array ARYL substantially has memory capacity of 262144 bits in total, namely so-called 256 Kbits, from the normal word lines and bit lines, plus the redundant capacity.

As shown in FIG. 3, the dynamic memory cells of memory array ARYL respectively include the address selection MOSFETQa and information accumulating capacitor Cs. The drains of address selection MOSFET$Q_a$s of 260 memory cells in total arranged in the same column of the memory array ARYL are alternately coupled with the predetermined rule to the corresponding complementary bit lines B0~B1023 or to the noninverted or inverted signal lines of redundant complementary bit lines BR0~BR7. Moveover, the gates of address selection MOSFET$Q_a$s of 1032 memory cells in total arranged in the same row are coupled in common respectively to the corresponding word lines W0~W255 or redundant word lines WR0~WR3. To the other electrodes of information accumulating capacitor $C_s$ of all memory cells, the predetermined plate voltage VPL is supplied in common.

In this embodiment, a memory cell forming the memory array ARYL is, although not restricted particularly, a so-called stacked structure (stacked capacitor) type memory cell as shown in FIG. 4 and such information accumulating capacitor $C_s$ is formed by polysilicon plate electrode PL and information accumulating electrode SP formed sandwiching the predetermined insulating film IS. Moreover, the address selection MOSFET$Q_a$ is formed by N-type diffused layers formed in the P-type well region PWELL of the P-type semiconductor substrate PSUB, namely the drain D and source S and polysilicon gate layer which is also used as the word lines W0~W255 or redundant word lines WR0~WR3. The drain D of address selection MOSFETQ$_a$ is coupled with the non-inverted bit line B0 consisting of tungsten polycide and the gate thereof, namely the word lines or redundant word lines are further coupled with the main word lines MW0~MW255 or MWR0~MWR3 for shunt. A bit line selection signal YS0 consisting of tungsten polycide is formed between the non-inverted bit line B0 and main word line. These bit line selection signal lines (YSL) are arranged, as will be explained later, through eight memory mats arranged adjacently in the extending direction of the bit line and therefore it has comparatively large wiring width as shown in FIG. 5.

The word lines W0~W255 and redundant word lines WR0~WR3 forming a memory array ARYL are connected, although not restricted particularly, with the corresponding X address decoder XDL or XDR at the one end thereof as shown in FIG. 3 and any one of these are selected to high level. Moreover, at the other end thereof, these are coupled to the ground potential of the circuit through the corresponding word line clear MOSFETQ25 and Q26. Therefore, when the dynamic RAM is non-selected, these are set to low level such as the ground potential of the line. The clear operation of such word lines and redundant word lines is selectively cancelled when the dynamic RAM is selected and any one of the the internal control signal WC0 or WC1 is set to low level. The complementary bit lines B0~B1023 and redundant complementary bit lines BR0~BR7 forming the memory array ARYL are coupled with a corresponding unit circuit of the sense amplifier SA.

2.2 Sense Amplifier

Figure 6:
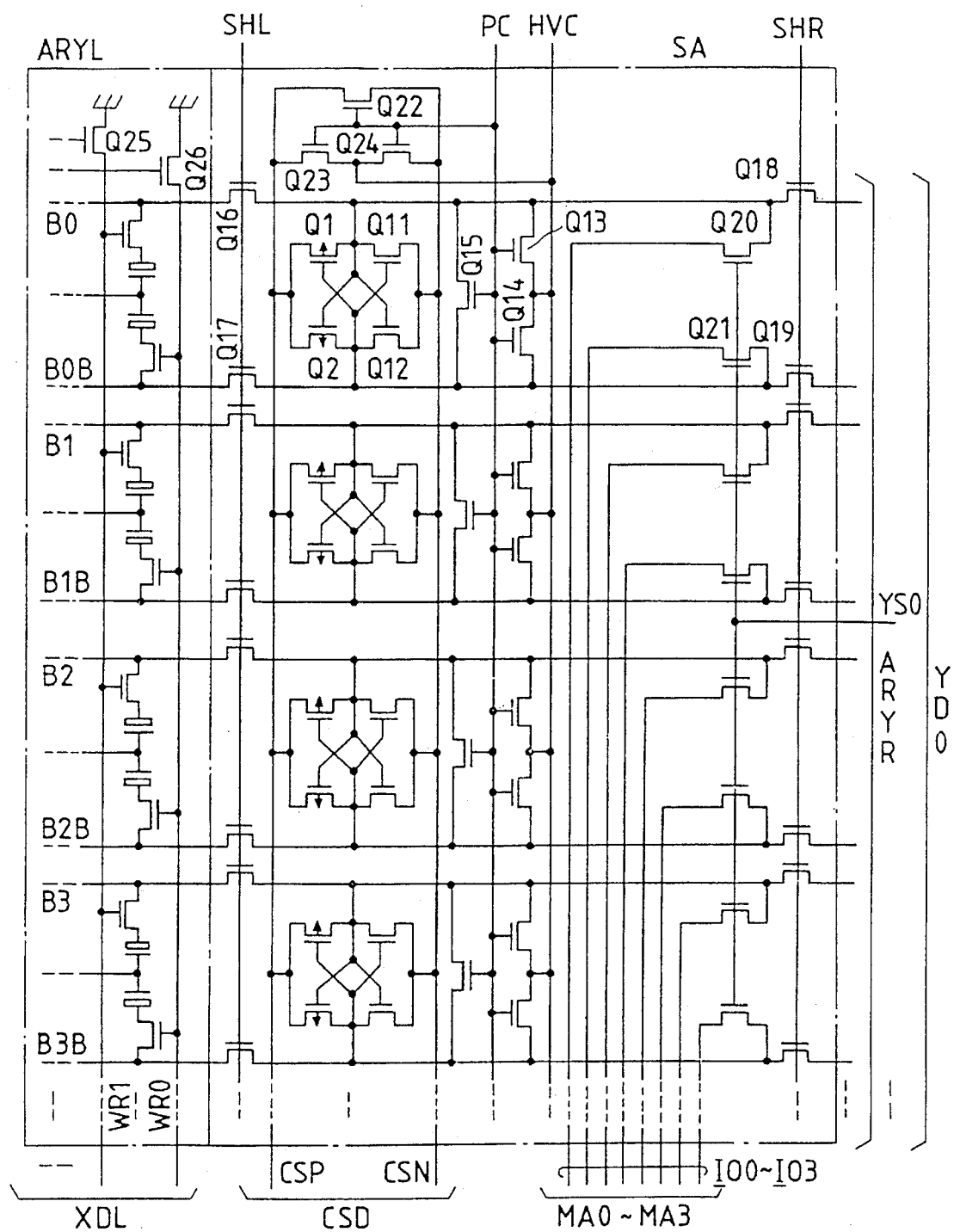
FIG. 6 is a partial circuit diagram indicating an embodiment of a sense amplifier included in the memory module of FIG. 2.

FIG. 6 shows a circuit diagram of an embodiment of the sense amplifier SA included in the memory mat MAT0 of memory module MOD0 of a dynamic RAM of FIG. 1 and FIG. 2. Outline of practical composition and operation of a sense amplifier forming a dynamic RAM will be explained with reference to an example of this sense amplifier SA.

In FIG. 6, the sense amplifier SA has total of 1032 unit circuits, although not restricted particularly, corresponding to the complementary bit lines B0~1023 and redundant complementary bit lines BR0~BR7 of the memory arrays ARYL and ARYR. These unit circuits have the basic composition of the unit amplifier circuit being cross-connected with a pair of CMOS inverter circuits consisting of the P-channel MOSFETQ1 and N-channel MOSFETQ11, P-channel MOSFETQ2 and N-channel MOSFETQ12. Each unit circuit of the sense amplifier SA has, although not restricted particularly, a bit line precharge consisting of the N-channel MOSFETQ13~Q15 and a bit line selection switch MOSFET represented by the N-channel MOSFETQ20 and Q21.

The non-inverted and inverted input output nodes of the unit amplifier circuit forming each unit circuit of the sense amplifier SA are respectively connected, when the internal control signal SHL is in the high level, to the corresponding complementary bit lines or redundant complementary bit lines of memory array ARYL through the shared MOSFETQ16 and Q17 in the left side and respectively connected, when the internal control signal SHR is in the high level, to the corresponding complementary bit lines or redundant complementary bit lines of memory array ARYR through the shared MOSFETQ18 and Q19 in the right side. The sources of P-channel MOSFETQ1 and Q2 forming each unit amplifier circuit are coupled in common to the common source line CSP, while the sources of N-channel MOSFETQ11 and Q12 are coupled in common to the common source line CSN. To these common source lines, a power supply voltage of the circuit or ground potential is selectively supplied through the corresponding drive MOSFET of the sense amplifier drive circuit CSD. The unit amplifier circuit forming each unit circuit of the sense amplifer SA is selectively operated when the power supply voltage the circuit or ground potential is supplied to the common source lines CSP and CSN. Under this operating condition, each unit amplifier circuit amplifies a very low level readout signal which is outputted through the corresponding complementary bit lines or redundant complementary bit lines from 1032 memory cells coupled with the selected word lines of the memory array ARYL or ARYR and provides binary readout signal of high level and low level.

The internal control signal PC is supplied from the timing generating circuit TG to the gates of MOSFETQ13~Q15 forming the bit line precharge circuit of the sense amplifier SA. Moreover, a predetermined precharge voltage HVC is supplied to the sources connected in common of MOSFETQ13 and Q14. This precharge voltage HVC is set, although not restricted particularly, to almost an intermediate potential between the power supply voltage of circuits and ground potential. The internal control signal PC is selectively set, when the dynamic RAM is non-selected, to a high level in the predetermined timing. In this case, both internal control signals SHL and SHR for shared are set to a high level. Thereby, when the internal control signal PC is set to a high level, MOSFETQ13~Q15 are selectively and simultaneously turned ON and precharge the non-inverted and inverted input/output nodes of corresponding unit amplifier circuit and non-inverted and inverted signal lines of complementary bit lines or redundant complementary bit lines to the precharge voltage HVC. Although not restricted particularly, similar common source line precharge circuit consisting of N-channel MOSFETQ22~Q24 is also provided between the common source lines CSP and CSN.

The other of the switches MOSFETQ20 and Q21 forming each unit circuit of the sense amplifier SA is coupled in every other four pairs to the non-inverted or inverted signal lines of four pairs of common I/O lines IO0~IO3. Moreover, the gates of these switches MOSFETs are sequentially connected in common in unit of four pairs and the corresponding bit line selection signals YS0~YS255 or redundant bit line selection signals YR0~YR1 are respectively supplied thereto from the Y address decoder YD0, etc. Thereby, the adjacent four pairs of switches MOSFETQ20 and Q21 are selectively and simultaneously turned ON when any one of the corresponding bit line selection signal or redundant bit line selection signal is set to a high level, and selectively connect the non-inverted and inverted input/output nodes of corresponding four unit amplifier circuits of sense amplifier and common I/O lines IO0~IO3.

2.3 DC Defect Saving System

Figure 7:
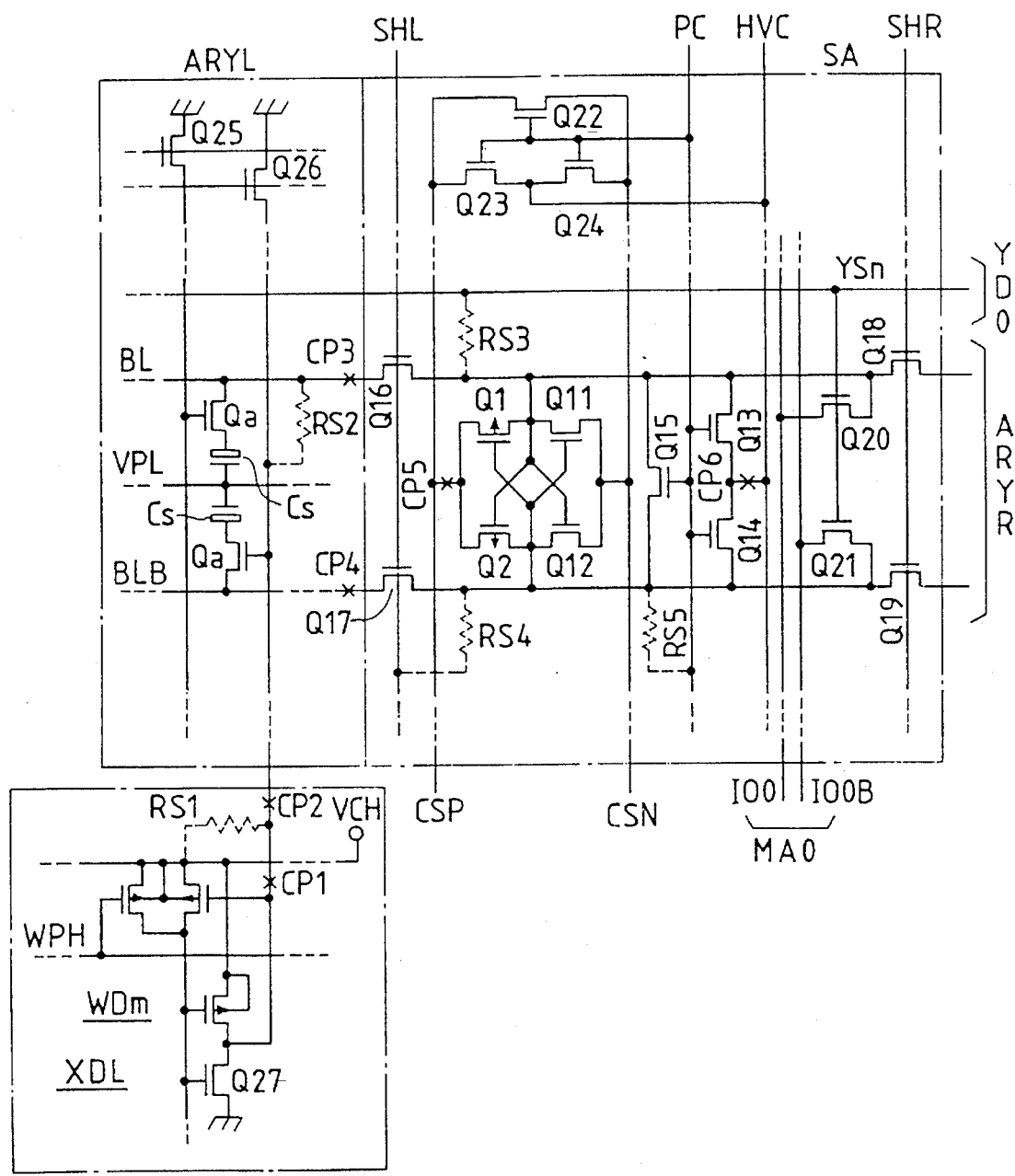
FIG. 7 is a partial circuit diagram indicating an embodiment of cutting points for DC defect saving of dynamic RAM of FIG. 1.
Figure 8:
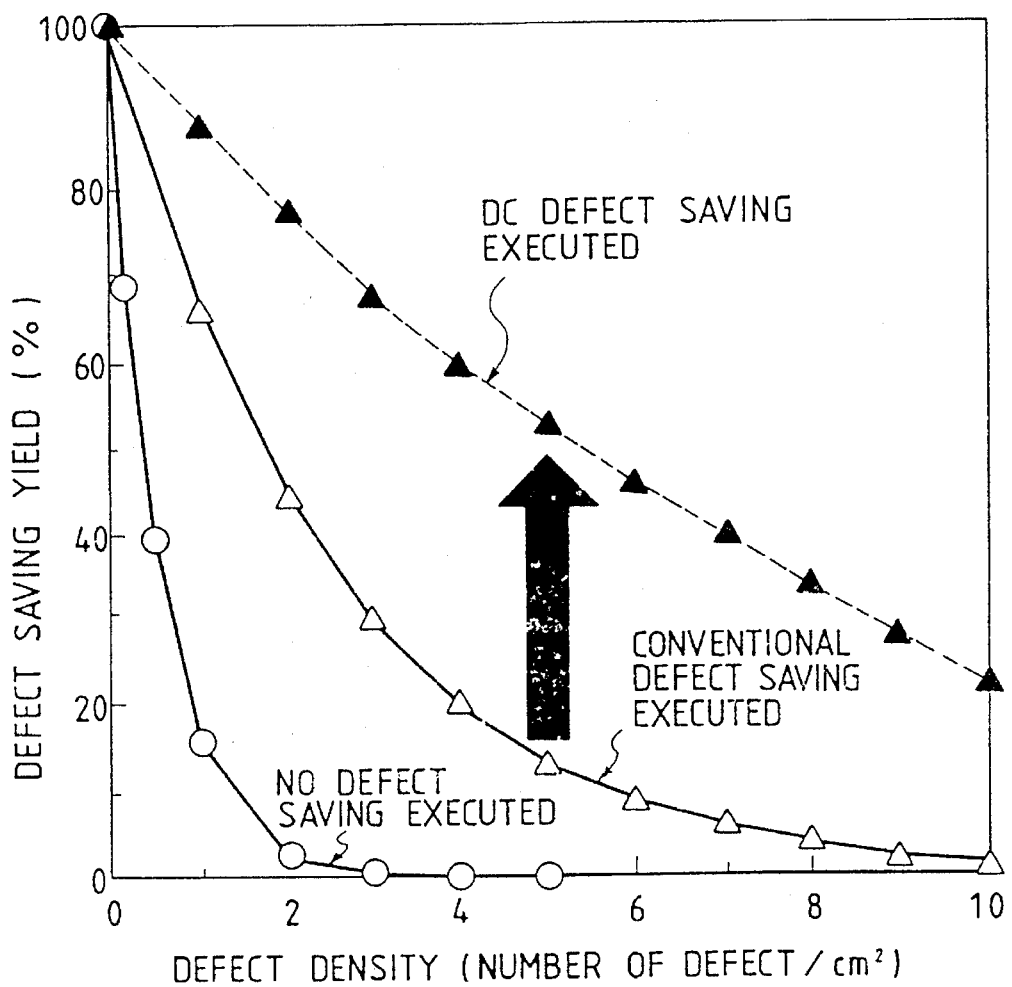
FIG. 8 is an evaluation graph for comparison and evaluation of DC defect saving system of dynamic RAM of FIG. 1.

FIG. 7 shows a memory array ARYL included in the memory mat MAT0 of memory module MOD0 of the dynamic RAM of this embodiment and a partial circuit diagram in the periphery thereof for explaining the DC defect saving system. FIG. 8 shows evaluation graphs of the DC defect saving system of FIG. 7. In addition, FIG. 9 to FIG. 13 respectively show a partial sectional composition and a plain composition of the sense amplifier SA in regard to the cutting points CP3 to CP6 shown in FIG. 7. The practical method and features of the DC defect saving of the dynamic RAM of the present embodiment will be explained hereunder. The DC defect saving explained hereunder will also be applied in the same manner to the paired memory array ARYR and the other memory arrays ARYL and ARYR forming the other memory mats or memory modules.

In FIG. 7, DC defects of dynamic RAM have been found by the inventors, although not restricted particularly, by unexpected short-circuitting failure at the following five points. Namely, (1) Short-circuitting between word lines WLm and word line selection level supply line, namely a high voltage VCH by the short-circuitting resistor RS1. In this case, when the dynamic RAM is not selected, a leak current path is formed from the high voltage VCH to the short-circuitting resistor RS1, word lines WLm and word line clear MOSFETQ26 or to the short-circuitting resistor RS1 and word line reset MOSFETQ27 and a stand-by current of the dynamic RAM increases, resulting in the DC defect. This is also applied to the inverted bit line BLB.

(2) Short-circuitting between word lines WLm and non-inverted bit line BL by the short-circuitting resistor RS2. In this case, when the dynamic RAM is not selected, a leak current path is formed from the precharge level supply line HVC to precharge MOSFETQ13, shared MOSFETQ16, non-inverted bit line BL, short-circuitting resistor RS2, word lines WLm and word line clear MOSFETQ26, or to precharge MOSFETQ23, common source line CSP, MOSFETQ2, precharge MOSFETQ14 and Q13, shared MOSFETQ16, non-inverted bit line BL, short-circuitting resistor RS2, word lines WLm and word line clear MOSFETQ26, and a stand-by current of dynamic RAM increases, resulting in DC defect. It is also applied to the inverted bit line BLB.

(3) Short-circuitting between non-inverted bit line BL and bit line selection signal YSn by the short-circuitting resistor RS3. In this case, when the dynamic RAM is not selected, a leak current path is formed from the precharge level supply line HVC to precharge MOSFETQ13, short-circuitting resistor RS3 and bit line selection signal line YSn or to precharge MOSFETQ23, common source line CSP, MOSFETQ2, precharge MOSFETQ14 and Q13, short-circuitting resistor RS3 and bit line selection signal line YSn and a stand-by current of dynamic RAM increases, resulting in DC defect. It is also applied to the inverted bit line BLB.

(4) Short-circuitting between inverted bit line BLB and shared signal line SHL by the short-circuitting resistor RS4. In this case, a leak current path is formed from precharge level supply line HVC to precharge MOSFETQ14, short-circuitting resistor RS4 and shared signal line SHL or to precharge MOSFETQ23, common source line CSP, MOSFETQ1, precharge MOSFETQ13 and Q14, short-circuitting resostor RS4 and shared signal line SHL and a stand-by current of dynamic RAM increases, resulting in DC defect. It is also applied to the shared signal line SHR.

(5) Short-circuitting between inverted bit line BLB and precharge control signal line PC by the short-circuitting resistor RS5. In this case, when the dynamic RAM is not selected, a leak current path is formed from precharge level supply line HVC to precharge MOSFETQ14, short-circuitting resistor RS5 and precharge control signal line PC and a stand-by current of dynamic RAM increases, resulting in DC defect.

In studying this situation, it might be considered that the current path could be partly cut by cutting between word line and word line clear MOSFETQ26. However, in this case, a problem is generated because the cut word line will he floated, so that capacitance of the information accumulating capacitor $C_s$ will be connected to the non-inverted or inverted signal line of the corresponding complementary bit lines, thereby destroying the capacitance balance of the complementary bit lines.

Therefore, in the dynamic RAM of the present embodiment, so-called DC defect saving system is employed, namely the corresponding current path is cut by cutting at a plurality of points through selective combination responsive to content of defect, a stand-by current of dynamic RAM is reduced for eliminating DC defect. In other words, (1) cutting point CP1, namely between the output node of word line drive circuit WDm corresponding to word lines WLm generating a defect and word line selection level supply line, namely high voltage VCH of X address decoder XDL, (2) cutting point CP2, namely between word lines WLm generating a defect and high voltage VCH, (3) cutting points CP3 and CP4, namely between non-inverted and inverted signal lines of complementary bit lines generating a defect and corresponding unit circuit of the sense amplifier SA, (4) cutting point CP5, namely between the sources of P-channel MOSFETQ1 and Q2 and common source line CSP of the unit amplifier circuit corresponding to the bit lines generating a defect of the sense amplifier SA, and (5) cutting point CP6, namely between the bit line precharge circuit, namely precharge MOSFETQ13 and Q14 corresponding to the bit lines generating a defect and precharge level supply line HVC of the sense amplifier SA.

As is well known, a product yield of a dynamic RAM after the defect saving is executed is lowered by generation of DC defects resulting from unexpected short circuitting failure.

Therefore, when product yield Y of a dynamic RAM of 64 Mbits is estimated, the product yield by the conventional defect saving is lowered, even if defect density $D_i$ is set to 5 (number of defects/cm$^2$), for example, as shown in FIG. 8, to about 15%, although the function good product rate, ignoring standby current, should be about 55%. In the dynamic RAM of the present invention, almost all DC defects can be eliminated, and so-called DC defect saving can be realized by disconnecting the wirings at a plurality of cutting points through the predetermined combination to disconnect the leak current path. As a result, the product yield of dynamic RAM can be improved, as shown by the arrow mark of FIG. 8, toward the function good product rate.

Figure 9:
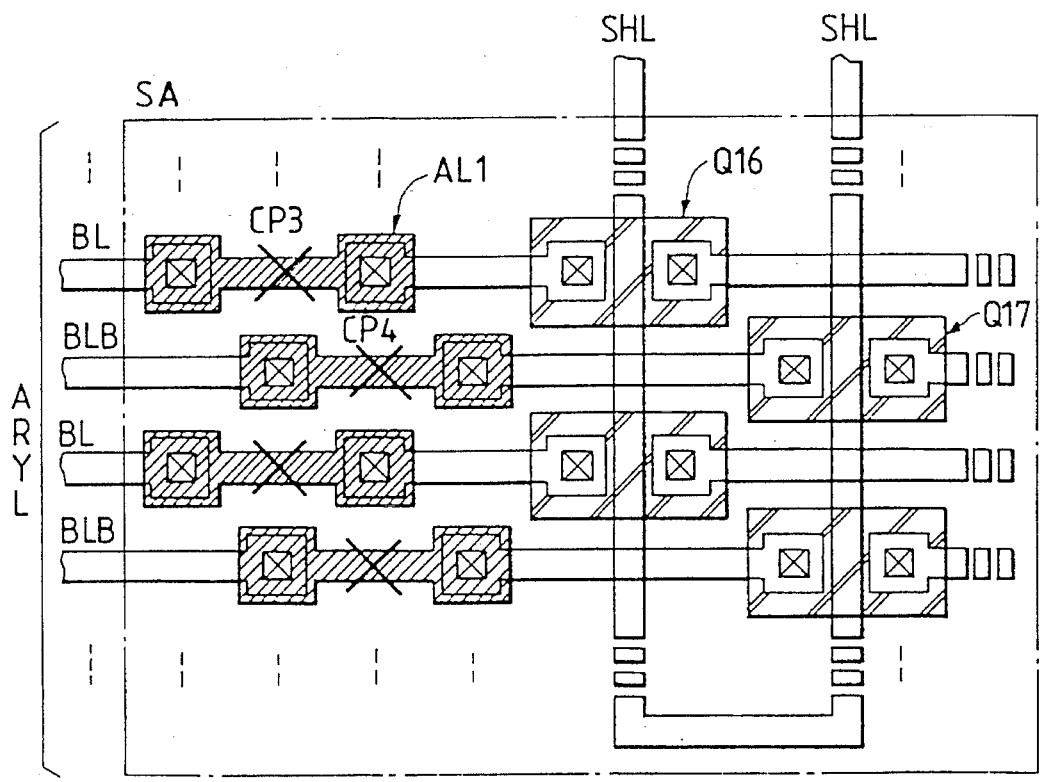
FIG. 9 is a partial plain composition indicating an embodiment of a part of cutting point of the sense amplifier of FIG. 6.
Figure 10:
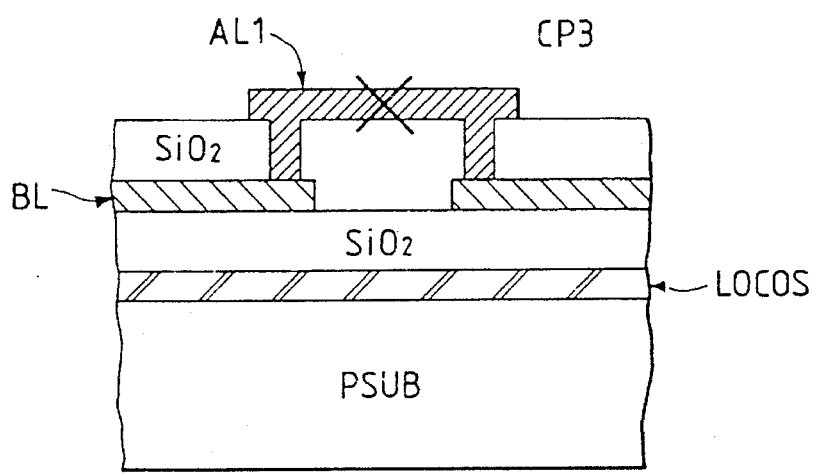
FIG. 10 is a partial sectional composition diagram indicating an embodiment of the cutting point of FIG. 9.

Cutting of such cutting points CP1 CP6 in the dynamic RAM of the present embodiment is realized, although not restricted particularly, by cutting directly or indirectly the upper most metal wiring layer, namely aluminum wiring layer with a wiring correction equipment explained later. Therefore, for example, in the case of the cutting point CP3, although not restricted particularly, as shown in FIG. 9 and FIG. 10, the non-inverted bit line BL formed by tungsten polycide is cut previously at each cutting point and moreover and such point is also connected through the aluminum wiring layer AL1 of the uppermost layer. Thereby, the non-inverted bit line BL is substantially cut only by cutting the aluminum wiring layer AL1 of the uppermost layer. A similar technique can be used for the cutting point CP4 with the inverted bit line BLB.

Figure 11:
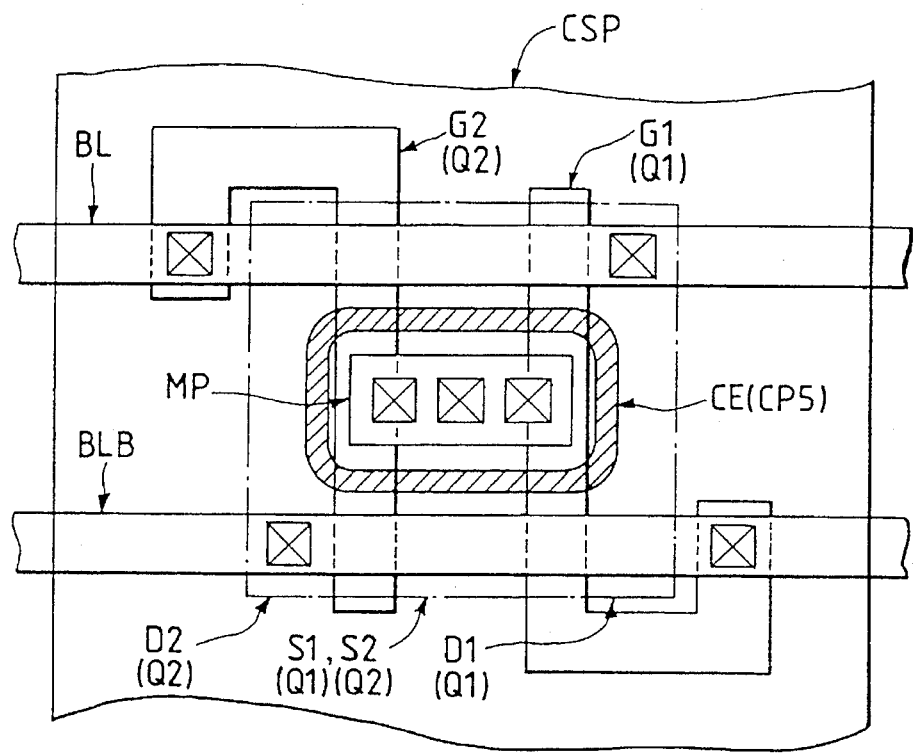
FIG. 11 is a partial plain composition diagram indicating an embodiment of the other cutting points of the sense amplifier of FIG. 6.
Figure 12:
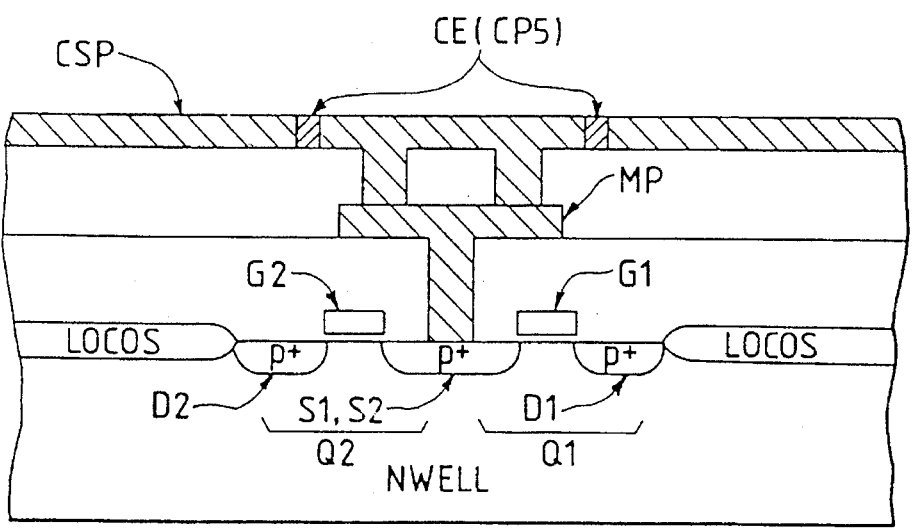
FIG. 12 is a partial sectional composition indicating an embodiment of the cutting points of FIG. 11.
Figure 13:
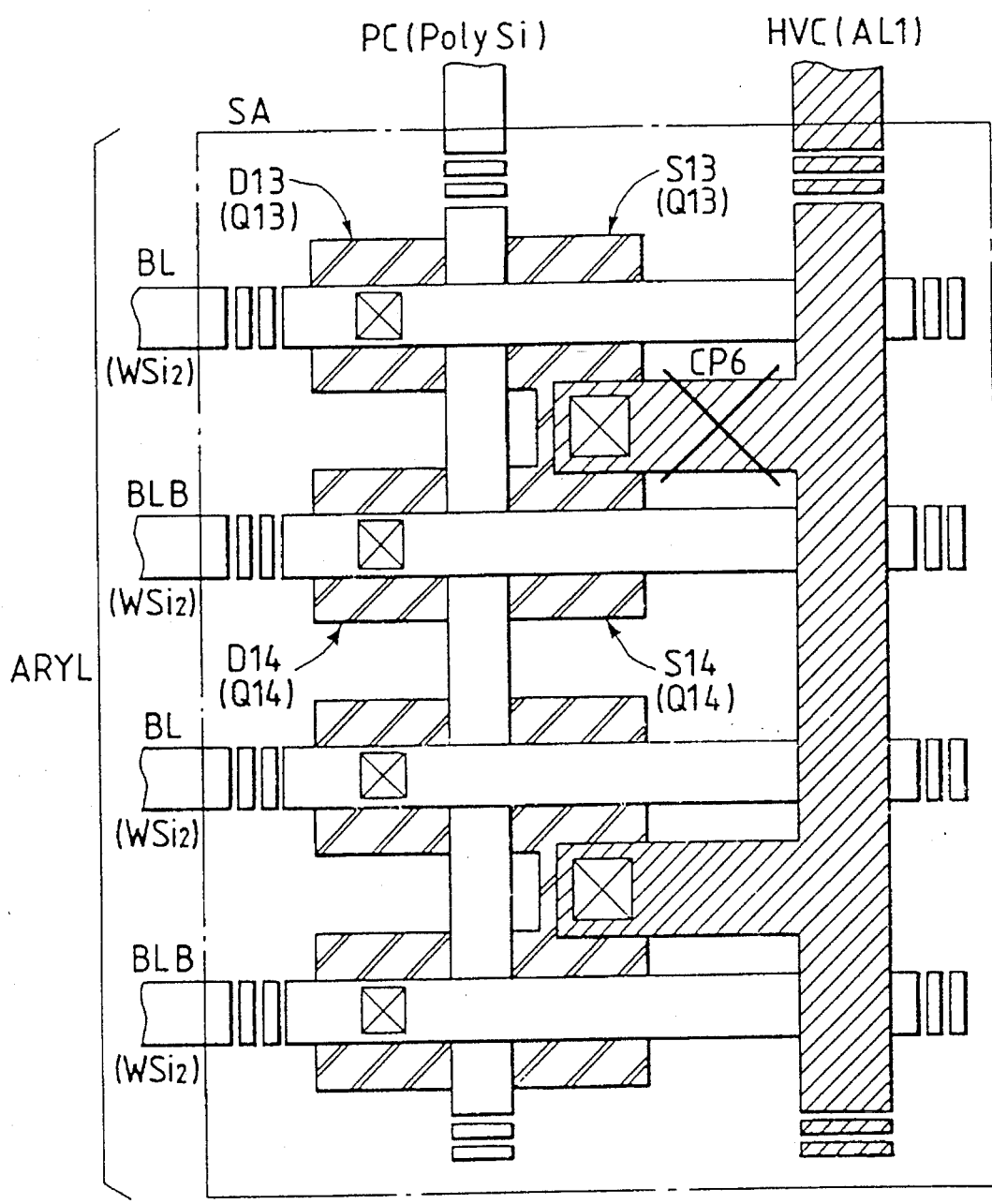
FIG. 13 is a partial plain composition indicating an embodiment of the other cutting points of the sense amplifier of FIG. 6.

Meanwhile, in the case of the cutting point CP5 from FIG. 7, cutting is substantially realized, although not restricted particularly, as shown in FIG. 11, by cutting the common source line CSP formed in the larger wiring width by the aluminum wiring layer AL of uppermost layer along the elliptical cutting region CE. Therefore, the sources S1 and S2 of the P-channel MOSFETQ1 and Q2 forming each unit amplifier circuit of the sense amplifier SA are coupled, as shown in FIG. 12, at the internal side of the aluminum wiring layer AL1 of the uppermost layer, namely the cutting region CE through the metal pad MP. Moreover, in the case of cutting point CP6, a leadout wire which is formed by the aluminum wiring layer AL1 of the upper most layer and can easily be cut is provided, as shown in FIG. 13, although not restricted particularly, between the diffused layer where the sources S13 and S14 of the bit line precharge MOSFETQ13 and Q14 are joined and the precharge level supply line HVC.

Figure 14:
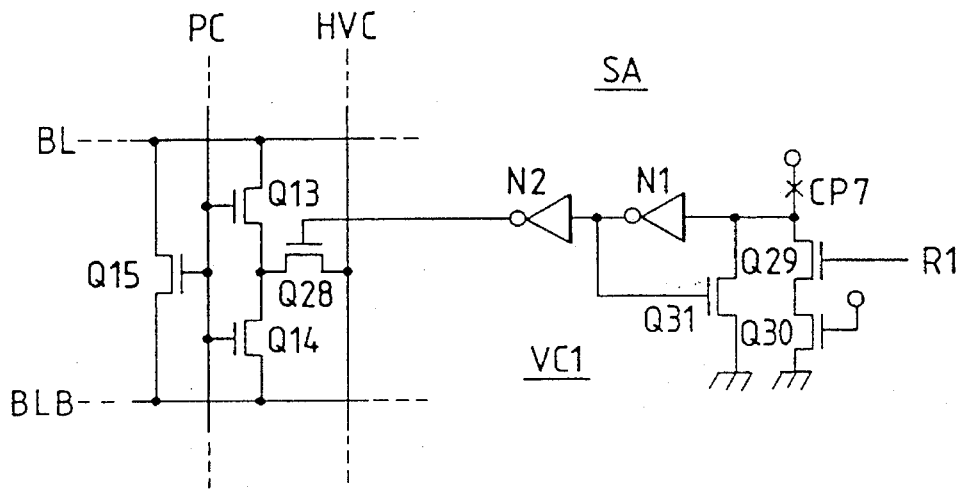
FIG. 14 is a partial circuit diagram indicating another embodiment of the sense amplifier included in the memory module of FIG. 2.
Figure 15:
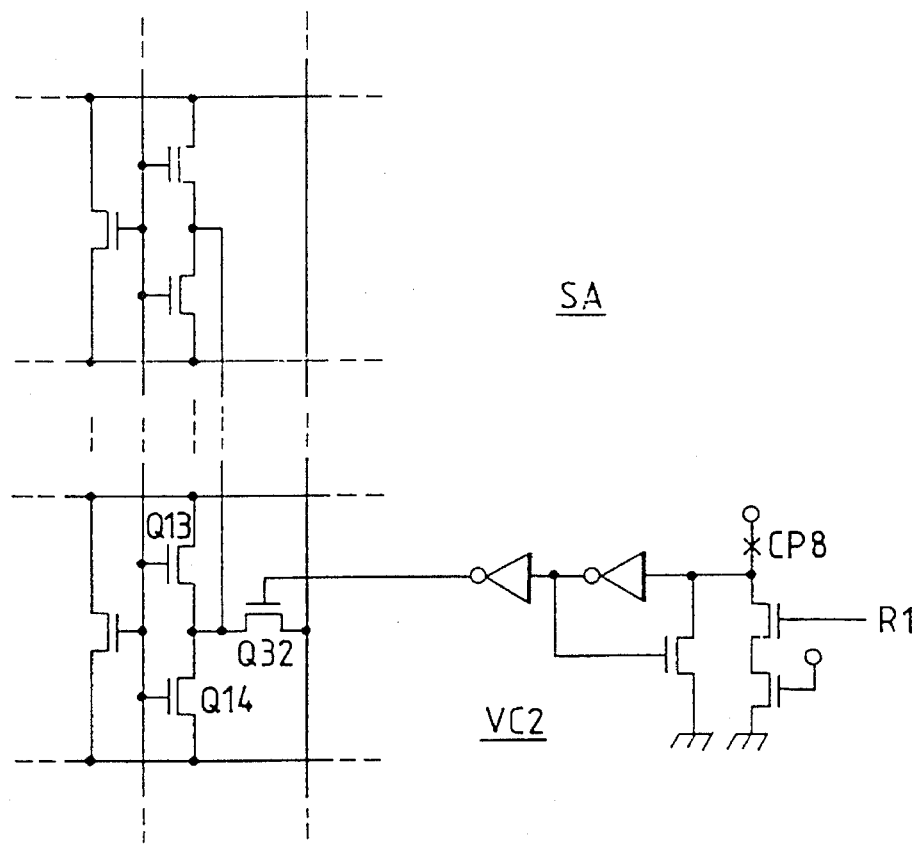
FIG. 15 is a partial circuit diagram indicating the other embodiment of the sense amplifier included in the memory module of FIG. 2.

FIG. 14 and FIG. 15 show the other two embodiments for realizing wiring cutting for DC defect saving. In FIG. 14, an N-channel MOSFETQ28 (switch means) which receives an output signal of an inverter circuit N2, namely unit control circuit VC1 at the gate thereof is provided, although not restricted particularly, between the sources of MOSFETQ13 and Q14 forming a bit line precharge circuit of the sense amplifier SA and the precharge level supply line HVC. A unit control circuit VC1 includes, although not restricted particularly, the N-channel MOSFETQ29 and Q30 provided in series between the power supply voltage of circuit and ground voltage and another N-channel MOSFETQ31 provided in parallel with these MOSFETQ29 and Q30. To the gate of MOSFETQ29, an internal control signal R1 is supplied and the gate of MOSFETQ30 is coupled with the power supply voltage of the circuits. The wiring provided between the power supply voltage of circuits and the drains connected in common of the MOSFETQ29 and Q31 is formed through the aluminum wiring layer AL1 of upper most layer as the cutting point CP7. The drains connected in common of MOSFETQ29 and Q31 are further connected to the input terminal of inverter circuit N1. An output signal of this inverter circuit N1 is supplied to an inverter circuit N2 and to the gate of MOSFETQ31.

When the wiring corresponding to the cutting point CP7 is not cut, an output signal of the inverter circuit N2 is set to a high level. In this case, in the sense amplifier SA, MOSFETQ28 is turned ON and the bit line precharge circuit consisting of MOSFET Q13~Q15 functions normally. Meanwhile, when the wiring corresponding to the disconnecting point CP7 is cut by the predetermined wiring correction equipment, an output signal of the inverter circuit N2 is set to a low level and MOSFETQ28 is turned OFF. Therefore, the sources of precharge MOSFETQ13 and Q14 are substantially cut from the precharge level supply line HVC and the leak current path formed through these elements is cut indirectly. Namely, cutting of wiring by this method is very effective in such a case that direct cutting is impossible due to the reason that a layout of the part including the cutting points is very complicated.

The embodiment of FIG. 15 is capable of using in common the switch means corresponding to MOSFETQ28 of FIG. 14, namely MOSFETQ32 and the unit control circuit VC2 with a plurality of bit line precharge circuit and is suppressing increase of the number of circuit elements.

2.3 Composition of partial products

A dynamic RAM of this embodiment comprises, as explained above, four memory modules MOD0—MOD3, and each module has four pairs of memory mat groups MG00 and MG01 to MG30 and MG31 which are symmetrically arranged in both sides of the main amplifier groups MAG0~MAG3. In this embodiment, these memory modules and memory mat groups are selectively invalidated when the predetermined wirings are cut. Thereby, the normal memory modules or memory mat groups not including any defects are selectively validated. In other words, defective memory modules or memory mat groups including defects are selectively separated to form a partial product of the dynamic RAM.

Namely, when two memory modules MOD2 and MOD3, for example, including defect are invalided, a partial product of the dynamic RAM having the memory capacity of 8 Mbits can be formed by the remaining two normal memory modules MOD0 and MOD1. In this case, the selecting operation of the memory modules MOD2 and MOD3 can be inhibitted by fixing, for example, the Y address signal AY11 of the most significant bit. On the other hand, when the four memory mat groups MG01~MG31 arranged in the right side of the main amplifier groups MAG0~MAG3, for example, are invalided, a partial product of the dynamic RAM having the memory capacity of 8 Mbits can be formed by the remaining four normal memory mat groups MG00~MG30. In this case, the selecting operation of memory mat groups MG01~MG31 can be inhibitted by fixing the X address signal AX11 of the most significant bit, for example, to a low level.

Figure 16:
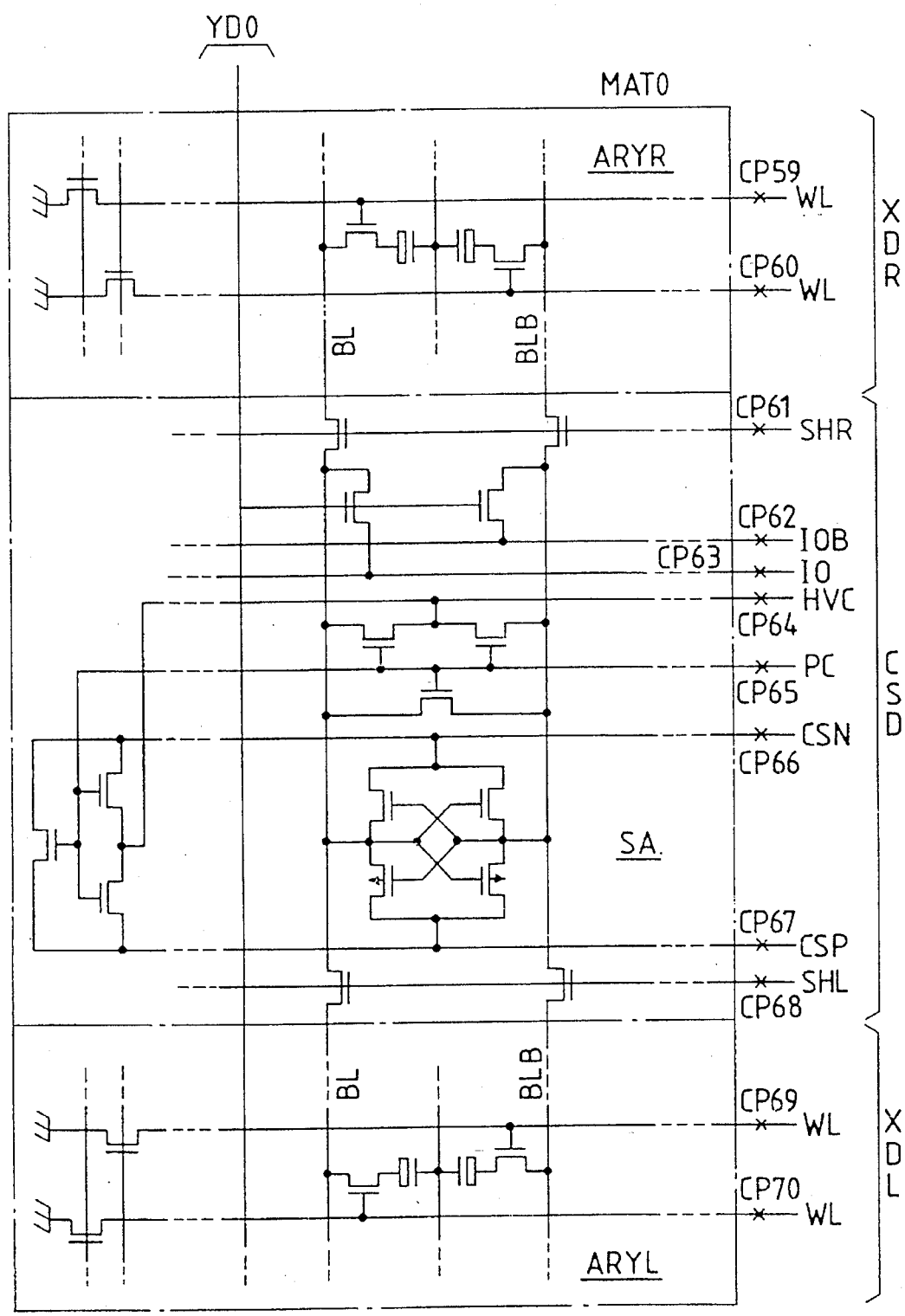
FIG. 16 is a circuit diagram indicating an embodiment of the cutting points to form a partial product of dynamic RAM of FIG. 1.

FIG. 16 shows a circuit diagram of an embodiment of the memory mat MAT0 forming a memory module MOD0 of the dynamic RAM to which the present invention is applied. The memory module MOD0 is selectively invalidated by invalidating eight memory mats MAT0~ MAT7 including this memory mat MAT0 and the memory mat group MG00 is selectively invalidated by invalidating four memory mats MAT0~MAT3 including the memory mat MAT0. A method for selectively invalidating the memory module MOD0 or memory mat group MG00 will be explained using the memory mat MAT0 as an example.

In FIG. 16, the memory mat MAT0 comprises, as explained previously, a pair of memory arrays ARYL and ARYR disposed symmetrically in both sides of the sense amplifier SA, a pair of X address decoders XDL and XDR provided corresponding to these memory arrays and a sense amplifier drive circuit CSD. In this embodiment, the word lines and redundant word lines (WL) forming the memory arrays ARYL and ARYR are coupled, as illustrated in FIG. 16, with the corresponding X address decoders XDL or XDR through the cutting points CP59 and CP60 or CP69 and CP70 consisting of the aluminum wiring layer AL1 of the upper most layer. Moreover, the shared signal lines SHL and SHR, common source lines CSP and CSN, precharge level supply line HCV and precharge control signal line PC provided between the sense amplifier SA and sense amplifier drive circuit CSD are coupled through the cutting points CP61 and CP64~CP68 consisting of the aluminum wiring layer AL1 of the upper most layer, and the non-inverted signal line IO and inverted signal IOB of the the common I/O lines are also coupled with the main amplifier group MAG0 through the cutting points CP62~CP63. Such cutting points CP59~CP70 are arranged, although not restricted particularly, almost on a straight line for efficient cutting process by the wiring correction equipment.

In case a plurality of defects are detected in the memory mat MAT0 and these defects cannot be saved by redundant switching, this memory mat MAT0 as a whole is decided as the defective mat. A partial product of the dynamic RAM is formed by the other normal memory modules or memory mat groups and the wiring correction data for separating defective memory modules or memory mat groups is transmitted on the on-line basis from a test equipment to the wiring correction equipment. Thereby, the cutting points CP59~CP70 are cut in a plurality of memory mats including the memory mat MAT0 and these memory mats are invalidated. As a result, almost all current paths are cut in the memory mats to be invalidated and thereby a low power consumption as a partial product of the dynamic RAM can be realized.

3. X and Y Selection Circuits and Redandunt Selection System

A dynamic RAM of this embodiment has memory capacity of 16 Mbits as explained above. When the dynamic RAM has so-called x1 bit composition, its address is designated by any one of the 12 bits X address signals AX0~AX11 and Y address signals AY0~AY11 which are supplied on the time sharing basis through the address input terminals A0~A11. The X address signals AX9~AX11 of upper three bits are supplied for designating any one of eight memory mats MAT0~MAT7 provided to each memory module. Moreover, the X address signal AX8 of the next bit is supplied for designating any one of the memory arrays ARYL or ARYR in each memory mat and the remaining X address signals AX0~AX7 of eight bits are supplied for designating any one of the 256 word lines of each memory array. In addition, the Y address signals AY10 and AY11 of upper two bits are used for selecting the main amplifiers MAG0~MAG3, namely the memory modules. MOD0~MOD3 of the data input/output circuit DIO, while the Y address signals AY0 and AY1 of lower two bits, for selecting the common I/O lines IO0~IO3 in each memory module. The remaining Y address signals AY2~AY9 of eight bits are used for selectively designating substantially 1024 pairs of complementary bit lines forming each memory array-in unit of four pairs.

On the other hand, the dynamic RAM of this embodiment is provided, as explained above, with a pair of memory array ARYL and ARYR corresponding to the memory mats MAT0~MAT7 and these memory arrays are provided respectively with four redundant word lines WR0~WR3 and eight pairs of redundant complementary bit lines BR0~BR7. In this embodiment, switching of these redundant word lines and redundant complementary bit lines to defective word lines or defective redundant bit lines is realized, as explained above, by the so-called decode system in which the logical conditions of X address decoder or Y address decoder are switched directly. Moreover, such switching is executed independently, although not restricted particularly, in each memory mat in unit of the grouped four word lines or four pairs of complementary bit lines. With reference to the block diagrams of FIG. 1 and FIG. 2 and circuit diagrams of FIG. 17 to FIG. 19, the composition of X-axis and Y-axis selection circuits of dynamic RAM and redundant switching system of this embodiment will be explained.

3.1 X-axis Selection Circuit and Redundant Word Line Switching System

The X-axis selection circuit of a dynamic RAM is formed, although not restricted particularly, by the X address decoders XDL and XDR provided corresponding to the memory arrays ARYL and ARYR of each memory module, and the X address buffer XAB, refresh address counter RFC, X predecoder XPD and memory mat selection circuit MSL provided in common to these X address decoders. The one input terminal of the X address buffer XAB among these circuits is coupled, although not restricted particularly, with the address input terminals A0~A11, while the other input terminal receives the refresh address signals AR0~AR9 of 10 bits from the refresh address counter RFC. The X address buffer XAB receives the internal control signal XL from the timing generation circuit TG.

The X address buffer XAB fetches, responsive to the internal control signal XL, the X address signals AX0 AX11 which are supplied on the time sharing basis through the address input terminals A0~A11 when the dynamic RAM is in the ordinary operation mode and then maintains such X address signals. Moreover, when the dynamic RAM is in the refresh mode, the X address buffer XAB also fetches and maintains the refresh address signals AR0~AR9 supplied from the refresh address counter RFC. Based on these address signals, the internal address signals X0~X11 are generated. Among these internal address signals, the internal address signals X9~X11 of upper three bits are supplied to the memory mat selection circuit MSL and the internal address signal X8 of the next bit to the timing generation circuit TG respectively. Accordingly the remaining internal address signals X0~X7 of eight bits are supplied to the X predecoder XPD.

The memory mat selection circuit MSL selects any one of the memory mat selection signals MS0~MS7 for selecting the memory mats MAT0~MAT7 in each memory module based on the internal address signals X9~X11 of three bits supplied from the X address buffer XAB. Moreover, the X predecoder XPD combines the internal address signals X0~X7 supplied from the X address buffer XAB in unit of two bits or three bits and decodes these internal address signals to form any one of the predecode signal XPD, namely, X0B~X3B, AX20~AX27 and AX50~AX57. The internal address signal X8 supplied to the timing generation circuit TG is used for selectively forming the shared internal control signals SHL or SHR.

Figure 17:
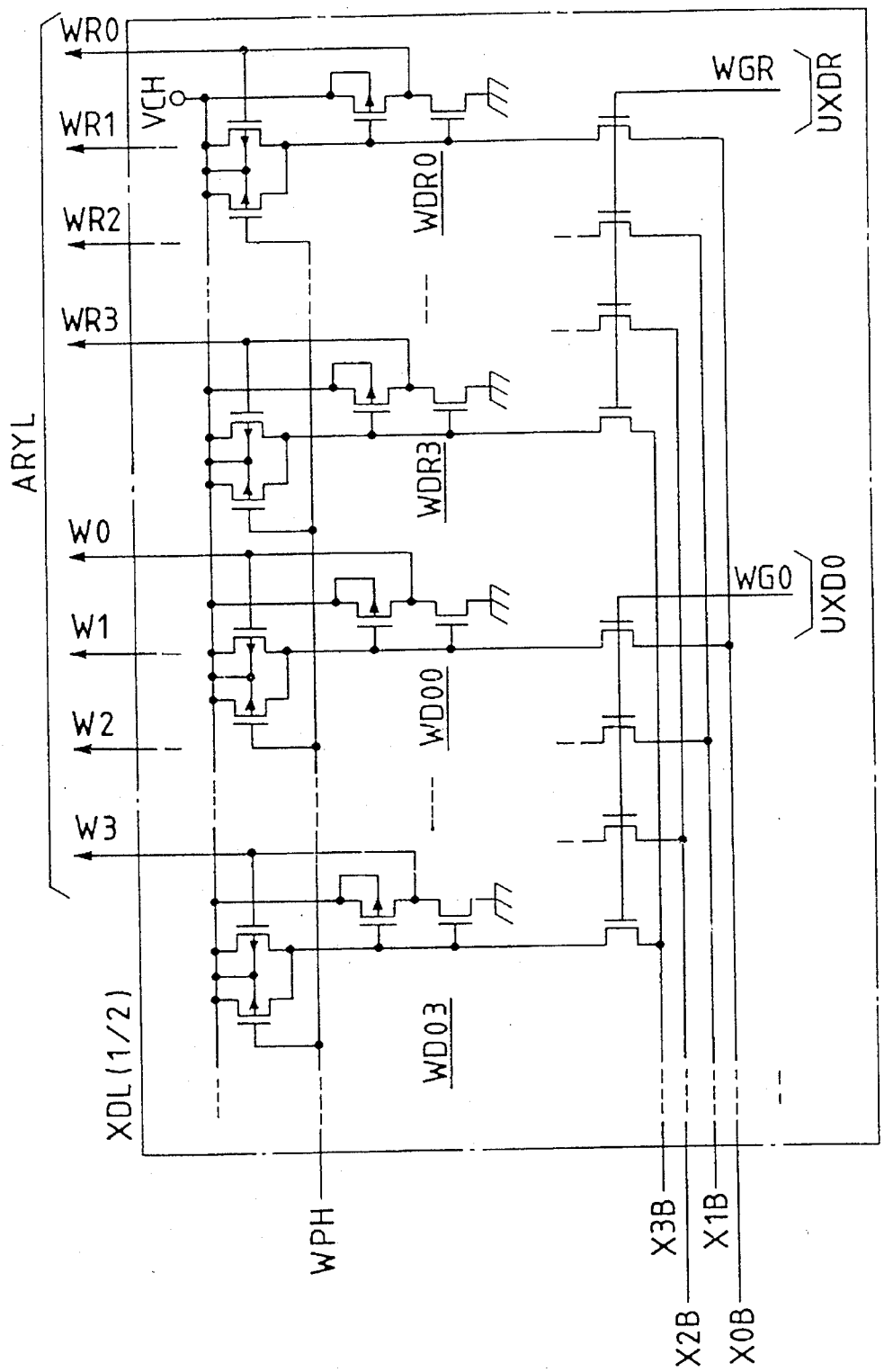
FIG. 17 is a circuit diagram indicating an embodiment of a word line drive circuit of X address decoder included in the memory module of FIG. 2.
Figure 18:
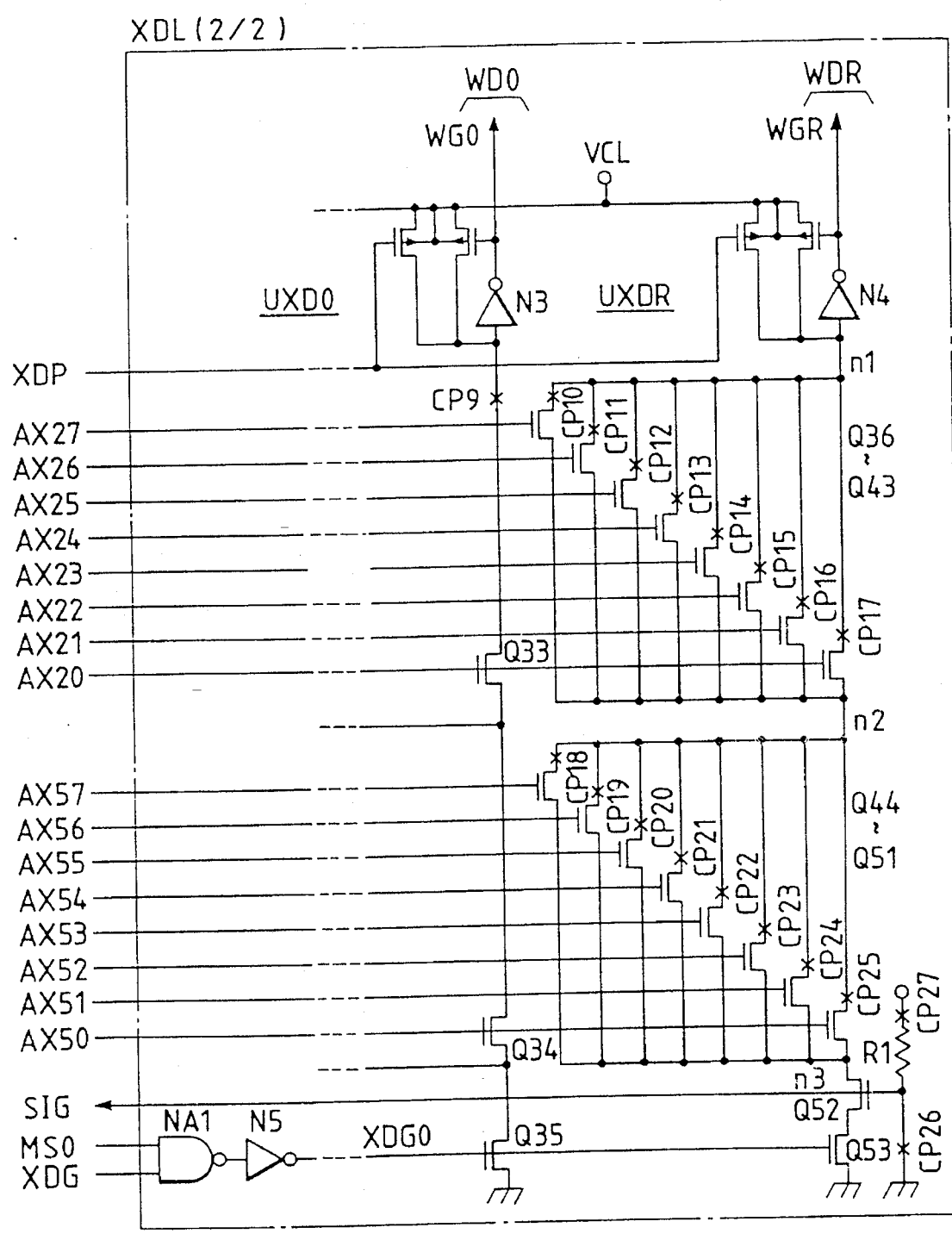
FIG. 18 is a circuit diagram indicating an embodiment of a unit X address decoder of an X address decoder included in the memory module.

Next, the X address decoders XDL and XDR comprises, although not restricted .particularly, a total of 260 word line drive circuits WD0~WD255 and WDR0~WDR3, as shown in FIG. 17 and FIG. 18, which are provided corresponding to the word lines W0~W255 and redundant word lines WR0~WR3 of the memory array ARYL. These word line drive circuits have, although not restricted particularly, a total of 65 unit X address decoders UXD0~UXD63 and UXDR corresponding to each word line drive circuit group, which are grouped in units of four decoders corresponding to the word line groups.

As shown in FIG. 17, an internal control signal WPH is supplied, although not restricted particularly, in common to the word line drive circuits WD0~WD255 and WDR0~WDR3 from the timing generation circuit TG and the corresponding inverted predecode signals X0B~X3B are also supplied thereto from the X predecoder XPD. Moreover, the corresponding unit X address decoders UXD0~UXD63 and UXDR supplies in common the output signals thereof, namely the word line group selection signals WG0~WG63 or WGR to four word line drive circuits WD0~WD3 to WD60~WD63 and WDR0~WDR3 forming each word line drive circuit group. The preferable one of the corresponding word lines W0~W255 or redundant word lines WR0~WR3 of the memory array ARYL is selectively set to high voltage VCH, when the inverted predecode signals X0B~X3B corresponding, although not restricted particularly, to the word line drive circuits WD0~WD255 and WDR0~WDR3 are set to a low level and the corresponding word line group selection signals WG0~WG63 or WGR are set to a high level.

The unit X address decoder UXD0~UXD63 includes, although not restricted particularly, a number of N-channel MOSFETQ33~Q35, as representatively shown by the unit X address decoder UXD0 of FIG. 18, forming a series of decoders through series and parallel disposition between the inverter circuit N3 and ground potential of circuits. Among these circuits, the predecode signals AX20~AX27 and AX50~AX57 are supplied through the predetermined combination to the gates of MOSFETQ33 and Q34 from the X predecoder XPD, while an output signal of the inverter circuit N5, namely an internal control signal XDG0 is supplied to the gate of MOSFETQ35. This internal control signal XDG0 is selectively set, although not restricted particularly, to a high level when the internal control signal XDG is set to a high level and the corresponding memory mat selection signal MS0 is set to a high level. In this case, an output signal of inverter circuit N3, namely word line group selection signal WG0 is selectively set to a high level because the predecode signals AX20~AX27 and AX60~AX57 are set to a high level in the corresponding predetermined combination. Thereby, the preferable one of the word line groups designated by the internal address signals X2~X7 is selected and moreover the single word line designated by the inverted predecode signals X0B~X3B, namely the internal address signals X0 and X1 is selected from four word lines included in such word line group. Although not restricted particularly, the wiring between the input terminal of inverter circuit N3 and the drain of MOSFETQ33 is formed as the cutting point CP9 through the aluminum wiring layer AL1 of the upper most layer and is used for cutting of defective word line group.

Meanwhile, the unit X address decoder UXDR corresponding to the redundant word lines WR0~WR3 comprises, although not restricted particularly, a total of 18 N-channel MOSFETQ36~Q53 provided in series or parallel between the inverter circuit N4 and ground potential of the circuits. The corresponding predecode signals AX20~AX27 are sequentially supplied to the gates of MOSFETQ36~Q43 provided in parallel between the internal nodes n1 and n2. Moreover, although not restricted particularly, the wiring between the internal node n1 and drain of each MOSFET is formed as the cutting points CP10~CP17 through the aluminum wiring layer AL1 of the upper most layer. In the same manner, the corresponding predecode signals AX50~AX57 are sequentially supplied to the gates of MOSFETQ44~Q51 provided in parallel between the internal nodes n2 and n3. In addition, the wiring between the internal node n2 and drain of each MOSFET is formed as the cutting points CP10~CP17 through the aluminum wiring layer AL1 of the upper most layer. Although not restricted particularly, the gate of MOSFETQ52 is coupled with the ground potential of the circuit and is also coupled to the power supply voltage of the circuit through the resistor R1. Both wirings between the gate of MOSFETQ52 and ground potential of the circuit, and between the resistor R1 and power supply voltage of the circuit are formed as the cutting points CP26 and CP27 through the aluminum wiring layer AL1 of the upper most layer. The internal control signal XDG0 is supplied to the gate of MOSFETQ53. Moreover, the gate potential of MOSFETQ52 is ORed, although not restricted particularly, with the other similar signals and then supplied to the signature circuit SIG as the internal control signal SIG.

In the initial condition of dynamic RAM where the cutting points CP9~CP27 are not cut, a gate potential of MOSFETQ52, namely internal control signal SIG is set to a low level such as the ground potential of the circuit. Therefore, MOSFETQ52 is turned OFF and the unit X address decoder UXDR provided corresponding to redundant word line group does not substantially work.

When the short-circuitting defect of word lines is detected by the function test of the dynamic RAM in the wafer condition thereof, the test equipment assigns the redundant word lines in accordance with the predetermined algorithm. Moreover, a wiring correction data for switching the word line group including a defective word line into a redundant word line group is generated and it is then transmitted, as explained later, to the wiring correction equipment by the on-line basis. The wiring correction equipment disconnects, for example, the cutting point CP9 of the corresponding unit X address decoder UXD0 based on this wiring correction data and respectively disconnects all cutting points CP10~CP17 and CP18~CP25 of the unit X address decoder UXDR, leaving only one cutting point required, for example, CP17 and CP25 connected and finally disconnects the cutting point CP26. Thereby, in the dynamic RAM, MOSFETQ52 is turned ON, and an output signal of the unit X address decoder UXDR, namely a word line group signal WGR is selectively set to a high level under the same condition as the selecting condition of the replaced word line group, in other words, the predecode signals AX20 and AX50, for example, are set to a high level. Accordingly, the word line group including a defective word line is replaced with a redundant word line group and switching to redundant word line can be realized.

3.2 Y-axis Selection Circuit and Redundant Complementary Bit Line Switching System A dynamic RAM of this embodiment comprises, although not restricted particularly, a total of four Y address decoders YD0~YD3 provided corresponding to two memory mat groups MG00 and MG10, MG01 and MG11, MG20 and MG30 and MG21 and MG31. These Y address decoders form a Y-axis selection circuit of the dynamic RAM with the Y address buffer YAB, Y predecoder YPD, memory module selection circuit MOSL and common I/O selection circuit IOSL.

The Y address buffer YAB fetches, responsive to the internal control signal YL, the Y address signals AY0~AY11 supplied on the time sharing basis through the address input terminals A0~A11 and generates the internal address signals Y0~Y11 based on these Y address signals. Among these signals, the internal address signals Y0 and Y11 of upper two bits are supplied to the memory module selection circuit MOSL, while the internal address signals Y0 and Y1 of lower two bits are supplied to the common I/O selection signal IOSL and the remaining internal address signals Y2~Y9 of eight bits to the Y predecoder YPD.

The memory module selection circuit MOSL generates the preferential one of the memory module selection signals NA0~NA3 for selectively activating the memory modules MOD0~MOD3 based on the internal address signals Y10 and Y11 of two bits supplied from the Y address buffer YAB and supplies the selected memory module selection signal to the data input/output circuit DIO. Moreover, the common I/O selection signal IOSL generates any one of the common I/O selection signals AS0~AS3 for selecting the common I/O lines IO0~IO3 based on the internal address signals Y0 and Y1 of two bits and supplies it to the main amplifier group MAG0~MAG3. Moreover, the Y predecoder YPD generates, although not restricted particularly, any one of the predecode signals YP, namely Y0~Y7, AY50~AY57 and AY80~AY83 by decoding the internal address signals Y2~Y9 through combination in unit of two bits or three bits.

Figure 19:
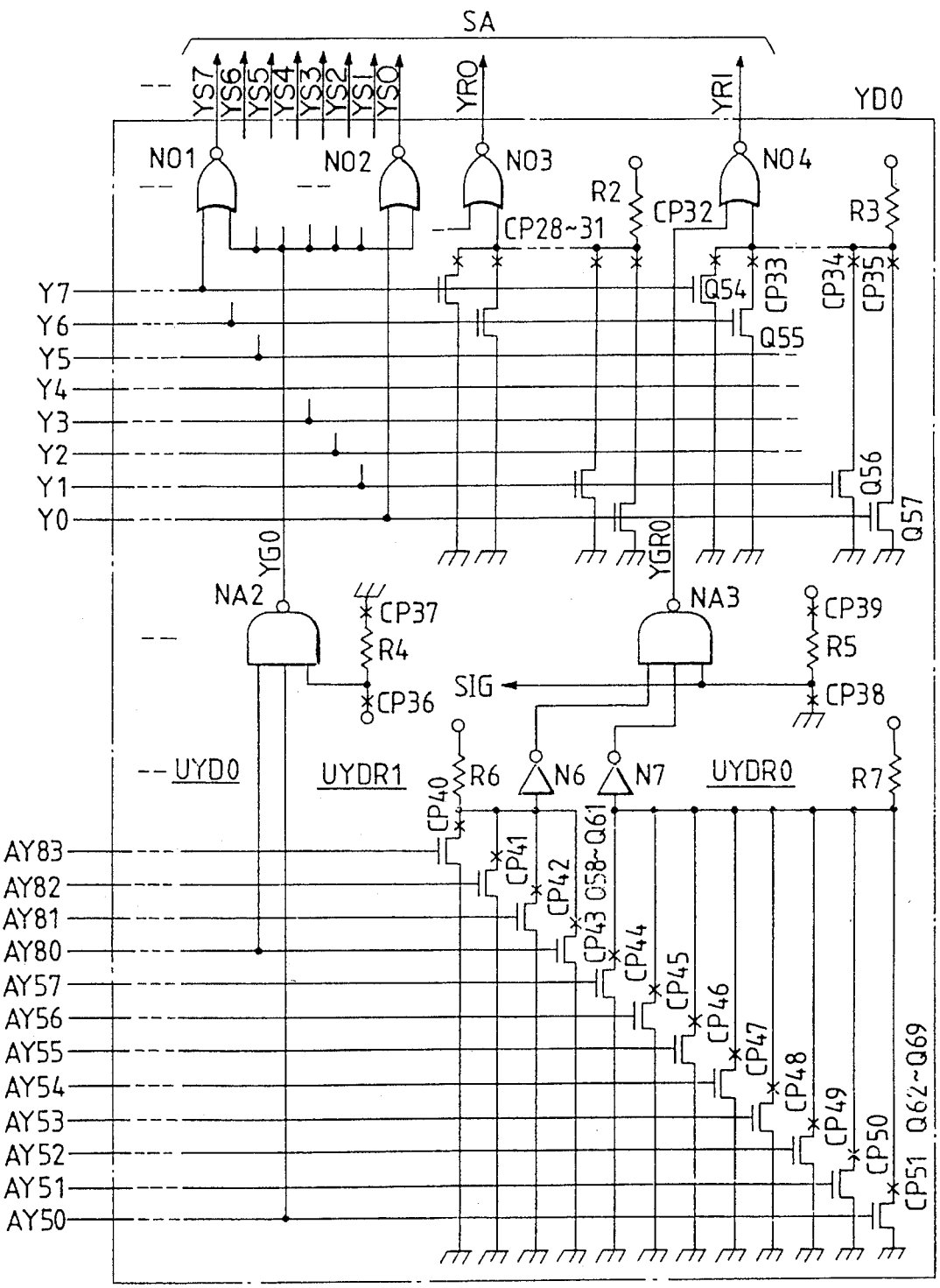
FIG. 19 is a partial circuit diagram indicating an embodiment of a Y address decoder of a dynamic RAM.

Next, the Y address decoders YD0~YD3 comprise, although not restricted particularly, a total of 256 NOR gate circuits NO1~NO2, etc. provided corresponding to each complementary bit line group, namely bit line selection signals YS0~YS255 and a total of 32 unit Y address decoders UYD0~UYD31 provided corresponding to eight circuits of these NOR gate circuits, as representatively shown by Y address decoder YD0 in FIG. 19. Moreover, the Y address decoders YD0~YD3 also comprise two NOR gate circuits NO3 and NO4 provided corresponding to each rebundant complementary bit line group, namely bit line selection signals YR0 and YR1 and two unit Y address decoders UYDR0 and YUDR1 provided corresponding to these NOR gate circuits. Among these circuits, the NOR gate circuits NO1~NO2 are, although not restricted particularly, grouped in a unit of adjacent eight circuits. The corresponding predecode signals Y0~Y7 are respectively supplied to the one input terminals of eight NOR gate circuits NO1~ NO2, etc. forming each group, while the output signals YG0 YG31 of the corresponding NAND gate circuit NA2, namely the unit Y address decoders UYD0~UYD31, are respectively supplied to the other input terminals of the eight NOR circuits NO1~NO2.

To the first and second input terminals of the NAND gate circuit NA2, although not restricted particularly, the predecode signals AY80~AY83 and AY50~AY57 are respectively supplied through the predetermined combination. The third input terminal is connected with the power supply voltage of the circuit and is also connected with the ground potential of the circuit through the resistor R4. The wirings between the third input terminal of the NAND gate circuit NA2 and the power supply voltage of the circuit and between the resistor R4 and ground potential of the circuit are formed as the cutting points CP36 and CP37 through the aluminum wiring layer AL1 of the uppermost layer. Thereby, the output signals YG0~YG31 of the unit Y address decoders UYD0 UYD31 are selectively set to a low level under the condition that the cutting point CP36 is not cut and the predecode signals AY50~AY57 and AY80~AY83 are set to a high level through the predetermined combination. Moreover, under the condition that corresponding output signals YG0 YG31 are set to a low level and the corresponding predecode signals Y0~Y7 are set to a low level, any one of the bit line selection signals YS0~S255 is set to a high level and the corresponding four complementary bit lines of memory array ARYL are connected to the corresponding common I/O lines IO0 IO3.

On the other hand, the one input terminals of the NOR gate circuits NO3 and NO4 provided corresponding to the bit line selection signals YR0 and YR1 for redundant complementary bit lines are, although not restricted particularly, connected with the ground potential of the circuit, as shown in FIG. 19, through the parallel eight N-channel MOSFETQ54~Q57 and is also coupled with the power supply voltage of the circuit through the resistor R3. The output signals YGR0 or YGR1 of the corresponding NAND circuit NA3 or NA4 (which is not illustrated), namely the unit Y address decoder UYDR0 or UYDR1 are supplied to the other input terminals of these NOR gate circuits NO4 or NO3. The corresponding predecode signals Y0 Y7 are supplied to the gate of MOSFETQ54~Q57. Although not restricted particularly, the wirings between the drain of MOSFETQ54~Q57, etc. and the one input terminals of the NOR gate circuits NO3 and NO4 are formed as the cutting points CP28~CP31 and CP32~CP35 through the aluminum wiring layer AL1 of the uppermost layer.

The first and second input terminals of the NAND gate circuit NA3 forming the unit Y address decoders UYD0 and UYD1 are respectively connected with the output terminals of inverter circuits N6 and N7. The third input terminal is coupled with the ground potential of the circuit and is also coupled with the power supply voltage of the circuit through the resistor R5. The wirings between the third input terminal of the NAND gate circuit NA3 and the ground potential of the circuit and between the resistor R5 and the power supply voltage of the circuit are formed as the cutting points CP38 and CP39 through the aluminum wiring layer AL1 of the uppermost layer. The input terminal of the inverter circuit N6 is connected with the ground potential of the circuit through four N-channel MOSFETQ58~Q61 disposed in parallel and is further coupled with the power supply voltage of the circuit through the resistor R6. The corresponding predecode signals AY80~AY83 are respectively supplied to the gates of MOSFETQ58~Q61. Moreover, the wirings between the drains of these MOSFETs and input terminal of inverter circuit N6 are formed as the cutting points CP40~CP43 through the aluminum wiring layer AL1 of the uppermost layer. In the same manner, the input terminal of inverter circuit N7 is coupled with the ground potential of the circuit through the parallel eight N-channel MOSFETQ62~Q69 and is then coupled with the power supply voltage of the circuit through the resistor R7. The corresponding predecode signals AY50~AY57 are respectively supplied to the gates of MOSFETQ62~Q69. Moreover, the wirings between the drains of these MOSFETs and the input terminal of inverter circuit N7 are formed as the cutting points CP44~CP51 through the aluminum wiring layer AL1 of the uppermost layer.

In the initial condition of the dynamic RAM where the cutting points CP28~CP51 are not cut at all, each third input of the NAND circuit NA3 and NA4 (which is not illustrated) forming the unit Y address decoders UYDR0 and UUYDR1, respectively, is fixed to the ground potential of the circuit, namely to a low level, while the output signals YGR0 and YGR1 are set to a high level. Therefore, the bit line selection signals YR0 and YR1 are fixed to a low level, and the unit Y address decoders UYDR0 and UYDR1 substantially does not operate.

When a short-circuit defect is detected in any complementary bit lines in the function test of dynamic RAM in the wafer condition, the redundant complementary bit lines are assigned by the test equipment and the related wiring correction data is transferred to the wiring correction equipment. In the Y address decoder YD0, the cutting points CP29~CP31 and CP32~CP35 are all cut leaving only required one cutting point connected, the cutting points CP40~CP43 and CP44~CP51 are all cut leaving only required one cutting point connected, and the cutting point CP38 is cut. As a result, the unit Y address decoder UYDR0 or UYDR1 is substantially validated and the bit line selection signal YR0 or YR1 is set selectively to a high level under the same selection condition as the replaced complementary bit line group, in other words, under the condition that the predecode signals AY50~AY57 and AY80~AY83 are set to a high level in the predetermined combination and the corresponding predecode signals Y0~Y7 are set to a high level. Thereby, the complementary bit line group including a defective complementary bit lines can be replaced with the redundant complementary bit line group, realizing the switching of the complementary bit lines to the redundant complementary bit lines.

As is obvious from explanation about the X-axis and Y-axis selection circuits, switching to the redundant circuit in the dynamic RAM of the present invention is effectively realized by the process that the predetermined wirings of the X address decoders XDL or XDR or Y address decoders YD0~YD3 are selectively cut by the wiring correction equipment which receives the wiring correction data on the in-line basis from the test equipment for executing a probe inspection under the wafer condition. It is a matter of course that switching to the redundant circuit in this dynamic RAM does not require the comparison and collating operation with the address supplied at the time of memory access to the defective address which has been done in the conventional dynamic RAM and also does not require the hardware for such operation. Therefore, in the dynamic RAM of this embodiment, the time required for selecting operation of the word lines or complementary bit lines can be shortened without relation to the switching to the redundant circuit and thereby the access time of dynamic RAM can also be shortened. Thereby, the number of circuit elements required for switching to redundant circuit can be reduced and the chip area of dynamic RAM can also be made small.

Figure 20:
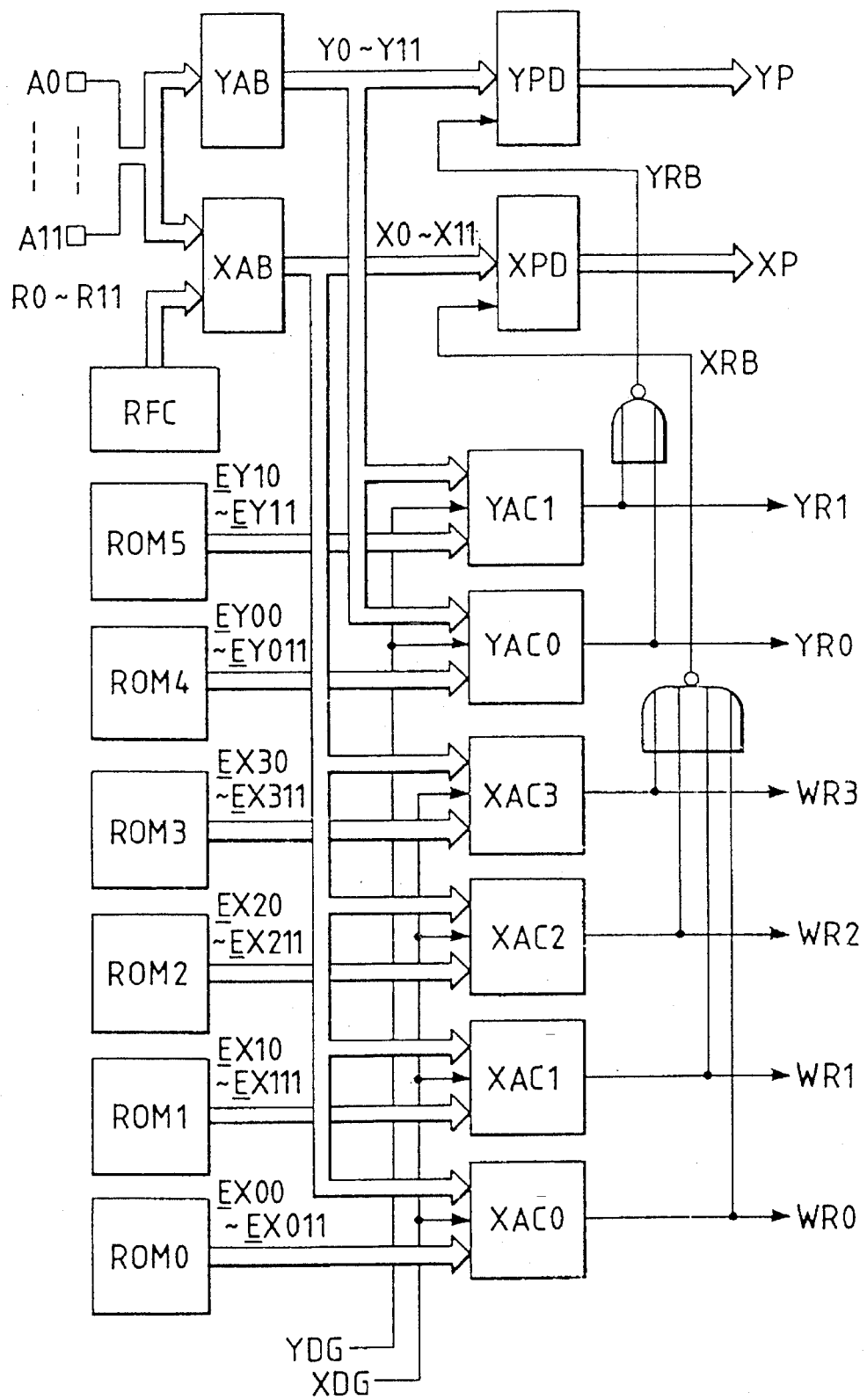
FIG. 20 is a partial block diagram indicating an embodiment in such a case that the present invention is applied to a conventional dynamic RAM introducing the switching to the redundant circuit by address comparison and collation.
Figure 21:
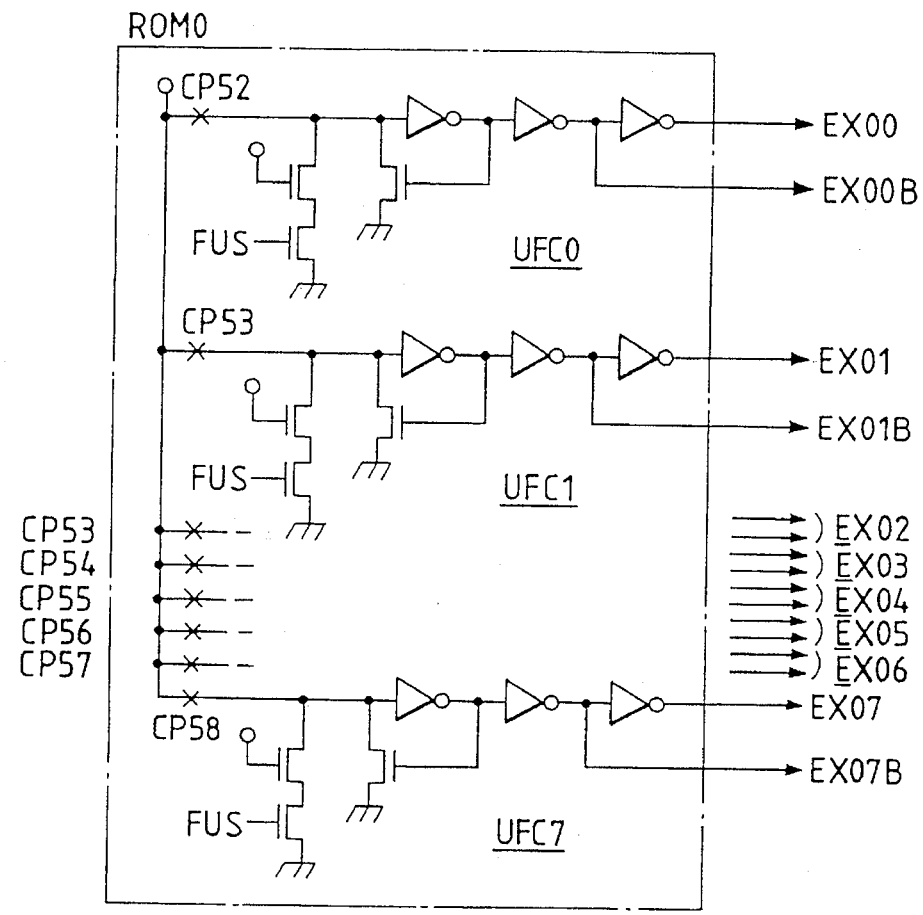
FIG. 21 is a partial circuit diagram indicating an embodiment of a defective address ROM included in the dynamic RAM.
Figure 22:
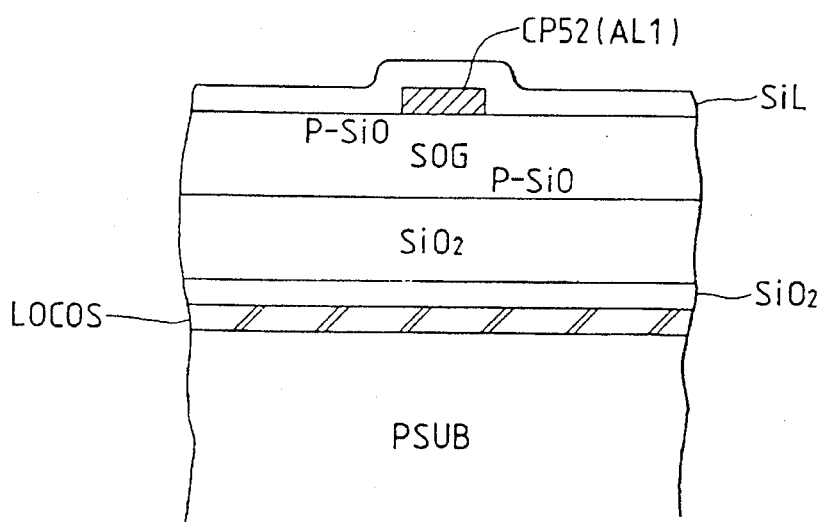
FIG. 22 is a partial sectional composition indicating an embodiment of a defective address ROM of FIG. 21.

3.3 Application to Switching to Redundant Circuit by Address Comparison and Collation FIG. 20 shows a partial block diagram in such a case that cutting of wirings by the wiring correction equipment is applied to a conventional dynamic RAM which employs the redundant circuit switching system by the address comparison and collation. FIG. 21 and FIG. 22 respectively show a partial circuit diagram and a sectional composition diagram of an embodiment of a defective address ROM included in the dynamic RAM shown in FIG. 20.

In FIG. 20, a dynamic RAM comprises four defective addresses ROM (ROM0~ROM3) provided corresponding to the redundant word lines WR0~WR3 and address comparison circuits XAC0~XAC3 and moreover two defective address ROMs (ROM4 and ROM5) provided corresponding to the redundant bit line selection signals YR0 and YR1 and address comparison circuits YAC0 and YAC1. These defective address ROM and address comparison circuit operate in the same manner as the conventional dynamic RAM, except for the following points and the corresponding redundant word lines or redundant complementary bit lines are selected for the selecting condition.

Namely, in this embodiment, the defective address ROM (ROM0~ROM5) comprises, for example, eight unit fuse circuits UFC0~UFC7 provided corresponding to each bit of defective address, as representatively shown by the defective address ROM (ROM0) of FIG. 21. Moreover, these unit fuse circuits, as shown in FIG. 22, include the cutting points CP52~CP58 which are formed through the aluminum wiring layer AL1 of the upper most layer to operate as the substantial fuse means. The non-inverted and inverted signals of the complementary output signals EX00~EX07 of the unit fuse circuits UFC0~UFC7 are respectively set to a high or low level when the corresponding cutting points CP52~CP58 are cut. Thereby, these unit fuse circuits operate as ROMs (Read Only Memory) for storing defective addresses assigned to the redundant word lines or redundant complementary bit lines.

In this embodiment, the cutting points CP52~CP58 provided in the defective address ROM (ROM0~ROM5) are cut by a high precision wiring correction equipment. Accordingly, these cutting points may be formed with a layout pitch which is remarkably smaller than that of the conventional fuse means formed by polysilicon. As a result, the required layout area of defective address ROM can be reduced as much and chip area of dynamic RAM can also be made smaller.

4. Power Supply Circuit and Internal Voltage Trimming System

In the dynamic RAM of this embodiment, realization of ultramicro miniaturization and high capacity of circuit elements forming memory array and peripheral circuits thereof has been progressed and therefore lowering of voltage resistance of these circuit elements and software error are considered as problems. Therefore, a greater part of the internal circuits of dynamic RAM operate with the operating power supply voltage which is equal to the internal power supply voltage VCL having comparatively small absolute value, for example, of +3.3 V and a voltage step-down circuit VD is provided for generating such internal power supply voltage VCL (e.g., see FIG. 23). On the other hand, in the dynamic RAM of this embodiment, operation is stabilized by controlling the operation characteristic of the MOSFETs by giving the predetermined substrate back bias voltage VBB to a P-channel semiconductor substrate and a substrate voltage generating circuit VBBG is provided for generating such substrate back bias voltage VBB (e.g., see FIG. 24). Moreover, in the dynamic RAM of this embodiment, as explained above, the so-called static word line selecting system has been employed so that the word line is selected by selectively transferring the predetermined high voltage VCH which is higher than the internal power supply voltage VCL at its absolute value to the designated word line selectively. Therefore, a high voltage generating circuit VCHG is provided to form such high voltage VCH. Hereinafter, compositions of the voltage step-down circuit VD and substrate voltage generating circuit VBBG and the trimming system of the internal power supply voltage VCL and substrate back bias voltage VBB will then be explained.

4.1 Voltage Step-Down Circuit and Internal Power Supply Voltage Trimming System

Figure 23:
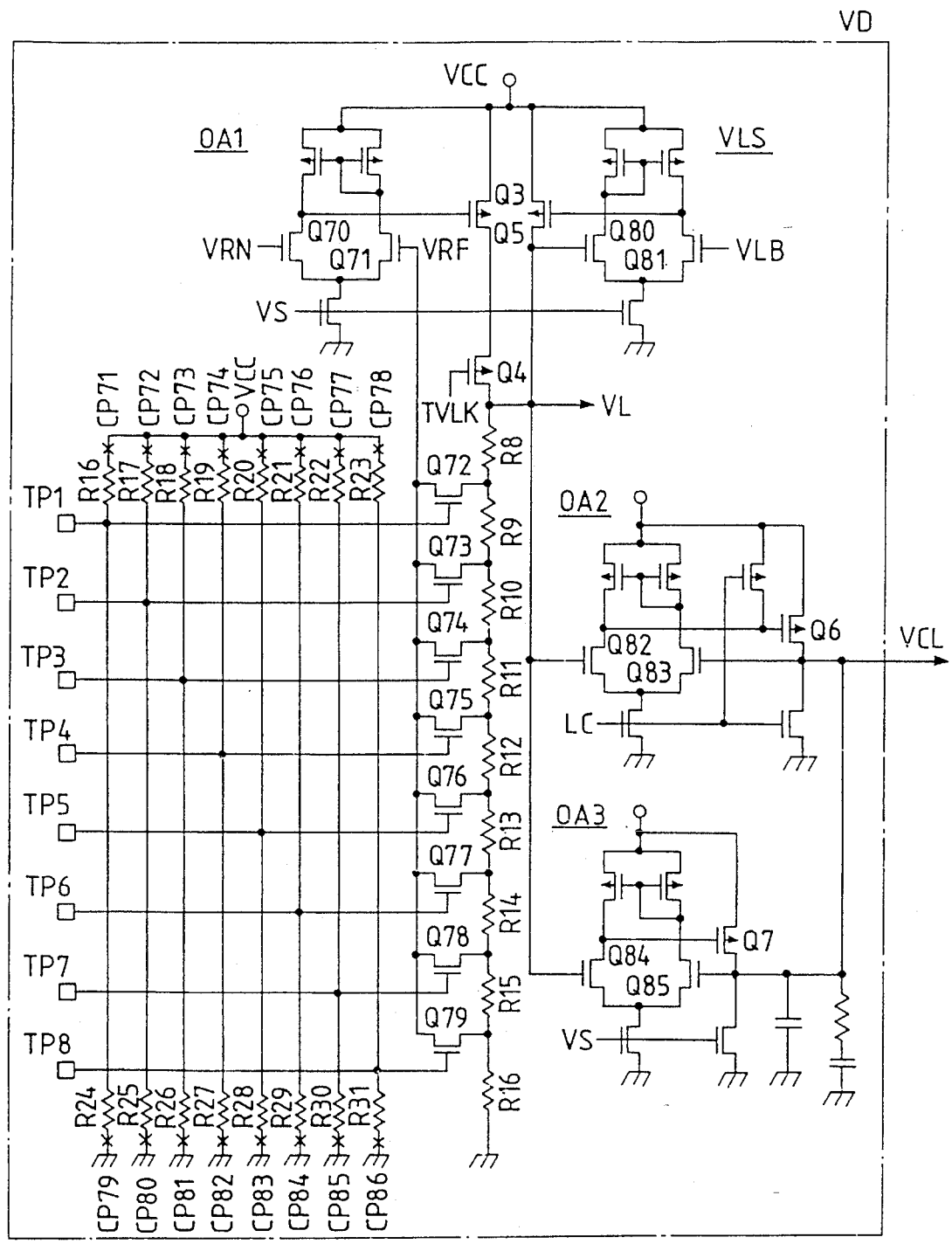
FIG. 23 is a partial circuit diagram indicating an embodiment of a voltage step-down circuit included in the dynamic RAM of FIG. 1.

FIG. 23 shows a circuit diagram of an embodiment of a voltage step-down circuit VD of a dynamic RAM of FIG. 1. In FIG. 23, the voltage step-down circuit VD comprises, although not restricted particularly, three arithmetic operation amplifier circuits OA1~OA3 basically formed by differential MOSFETs and a reference potential switching circuit VLS basically formed by differential MOSFETs to generate a predetermined internal power supply voltage VCL based on an external power supply voltage VCC supplied through the external terminal VCC. In this embodiment, the external power supply voltage VCC is, although not restricted particularly, set to a positive power supply voltage such as +5.0 V, while the internal power supply voltage VCL is set to +3.3 V as explained previously.

To the gate of the one differential MOSFETQ70 forming an operation amplifier circuit OA1 of the voltage step-down circuit VD, although not restricted particularly, a constant voltage VRN is supplied from a constant voltage generating circuit not illustrated and the drain thereof is coupled with the gate of the P-channel output MOSFETQ3. The source of this output MOSFETQ3 is coupled with the external power supply voltage VCC, the drain thereof is coupled with the reference potential output node VL through the P-channel MOSFETQ4 receiving the internal control signal TVLK at its gate and moreover is coupled with the ground potential of the circuit through nine series resistors R8~R16. The nodes connected in common of the adjacent two resistors of these series resistors are coupled with the gate of the other differential MOSFETQ71 through the N-channel MOSFETQ72~Q79. The gates of MOSFETQ72~Q79 are coupled, although not restricted particularly, with the corresponding test pads TP1~TP8, respectively. Moreover, these gates are coupled with the external power supply voltage VCC through the corresponding resistors R16~R23 and is connected to the ground potential of the circuit through the corresponding resistors R24~R31. The wirings between the resistors R16~R23 and external power supply voltage VCC are formed as the cutting points CP71~CP78 through the aluminum wiring layer AL1 of the upper most layer in the same manner, the wirings between the resistors R24~R31 and the ground potential of the circuit are formed as the cutting points CP79~CP86 through the aluminum wiring layer AL1 of the upper most layer.

When the cutting points CP71~CP86 are not cut and the dynamic RAM is in the initial condition, any one of the MOSFETQ72~Q79 is turned ON when a high level test control signal such as the external power supply voltage VCC is supplied to the corresponding test pads TP1~TP8. In this case, the reference potential VL is divided by a combined resistor RH of the series resistors in the side of the reference potential output node VL of MOSFETQ72~Q79 in the ON state and a combined resistor RL of series resistors in the side of ground potential of the circuit and thereafter is supplied to the gate of differential MOSFETQ71 as the feedback voltage VRF. When the feedback voltage VRF is lower than the constant voltage VRN, the drain voltage of the differential MOSFETQ70, namely the gate voltage of output MOSFETQ3 is set to a low voltage. Therefore, conductance of output MOSFETQ3 is set to a large value and thereby the reference potential VL, namely the feedback voltage VRF is set to a high voltage. On the other hand, when the feedback voltage VRF is higher than the constant voltage VRN, the drain voltage of differential MOSFETQ70, namely the gate voltage of output MOSFETQ3 is set to a high voltage. Accordingly, conductance of output MOSFETQ3 is set to a small value and thereby the reference voltage VL, namely the feedback voltage VRF is set to a low voltage. Namely, the operation amplifier OA1 operates for matching between the feedback voltage VRF and constant voltage VRN and as a result, sets the reference voltage VL to the following value.

$$VL = VRN \times (1 + RH/RL)$$

The reference potential VL is supplied to the gate of the one differential MOSFETQ82 forming an operation amplifier OA2 and is also supplied to the gate of the one differential MOSFETQ84 forming an operation amplifier OA3. The operation amplifier OA2 includes a P-channel output MOSFETQ6 having a comparatively large conductance and is capable of supplying a comparatively large current. This operation amplifier OA2 is therefore selectively operated when the dynamic RAM is selected and the internal control signal LC is set to a high level for matching between the reference potential VL and internal power supply voltage VCL. Meanwhile, the operation amplifier OA3 includes a P-channel output MOSFETQ7 having a comparatively small conductance and is capable of supplying a comparatively small current. The operation amplifier OA3 is usually operated for matching between the reference voltage VL and internal power supply voltage VCL. Thereby, the internal power supply voltage VCL is set to the following potential.

$$VCL = VL = VRN \times (1 + RH/RL)$$

As explained above, a value of the combined resistors RH and RL is selected when a high level test control signal is supplied to the test pads TP1~TP8. These test control signals are supplied, although not restricted particularly, from the test equipment during the probe test of dynamic RAM conducted under the wafer condition. The test equipment generates wiring correction data for cutting the cutting points CP71~ CP86 based on this test result and sends such data to the wiring correction equipment on the in-line basis. The wiring correction equipment selectively combines and disconnects the disconnecting points CP71~CP86 responsive to the wiring correction data from the test equipment. Thereby, the reference voltage VL is set to the optimum level by the trimming.

Figure 24:
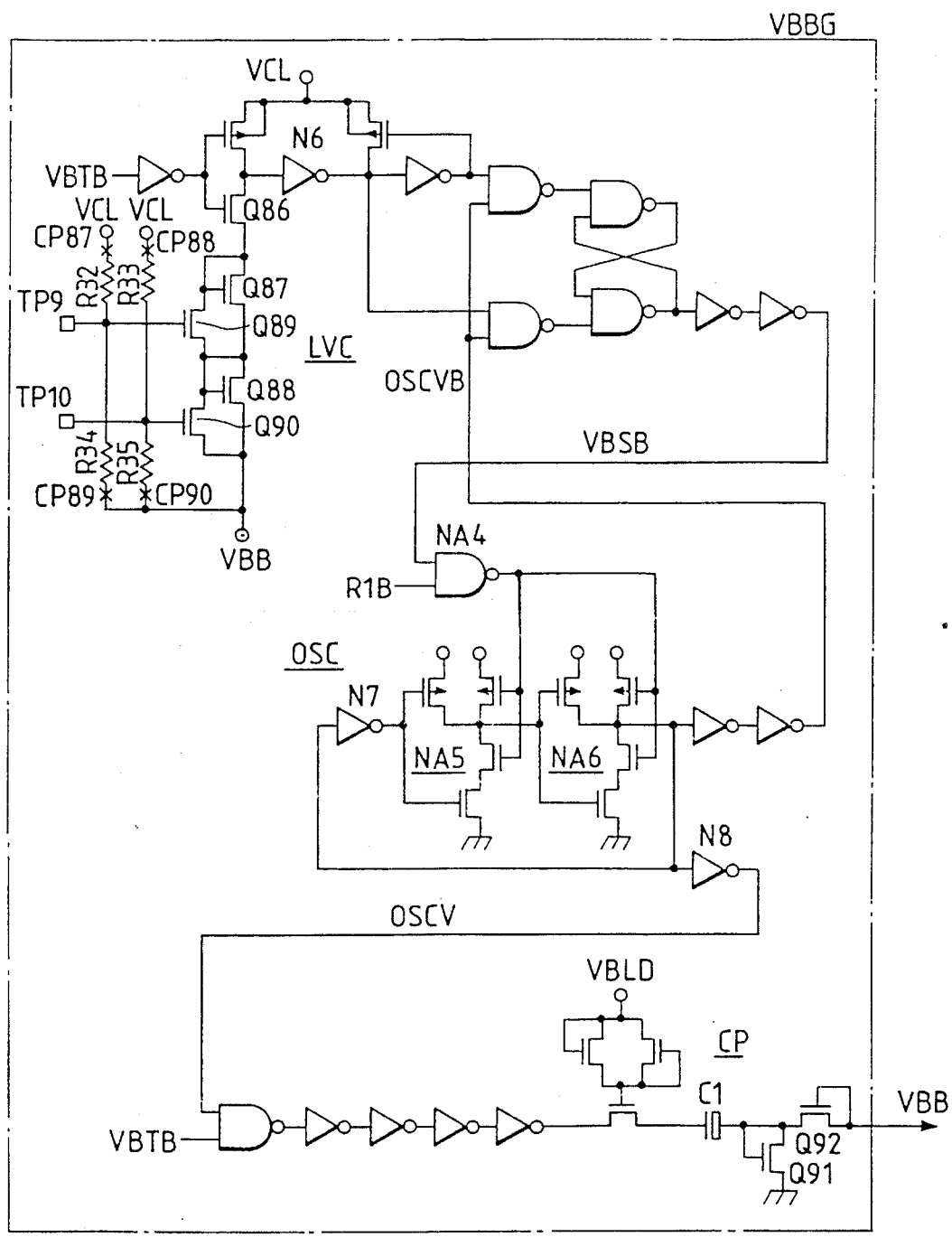
FIG. 24 is a partial circuit diagram indicating an embodiment of a substrate voltage generating circuit included in the dynamic RAM of FIG. 1.

4.2 Substrate Voltgage Generating Circuit and Substrate Back Bias Voltage Trimming System FIG. 24 indicates a circuit diagram of an embodiment of the substrate voltage generating circuit VBBG of the dynamic RAM of FIG. 1. In FIG. 24, the substrate voltage generating ciricuit VBBG comprises, although not restricted particularly, a level detection circuit LVC, an oscillation circuit OSC and a charge pump CP to form a predetermined negative substrate back bias voltage VBB based on the internal power supply voltage VCL.

The level detection circuit VLC of the substrate voltage generating circuit VBBG includes, although not restricted particularly, three N-channel MOSFETQ86~Q88 which are provided in series between the input terminal of the inverter circuit N6 operating as the level deciding circuit and the substrate back bias voltage supplying point VBB. Among these MOSFETs, an inverted signal of the internal control signal VBTB is supplied, although not restricted particularly, to the gate of MOSFETQ86, while MOSFETQ87~Q88 are connected in the mode of diode since the gates and drains thereof are connected in common. An N-channel MOSFETQ89 is provided between the common-connected gate and drain of MOSFETQ87 and the Common-connected gate and drain of MOSFETQ88 and an N-channel MOSFETQ90 is provided between the common-connected gate and drain of MOSFETQ88 and the substrate back bias voltage supplying point VBB. The gates of these MOSFETQ89 and Q90 are respectively coupled with the corresponding test pads TP9 and TP10. Moreover, these gates are also coupled with the power supply voltage of the circuit through the corresponding resistors R32 and R33 and to the substrate back bias voltage supplying point VBB through the corresponding resistors R34 and R35. The wirings between the resistors R32 and R33 and the power supply voltage of the circuit are formed as the cutting points CP87 and CP88 by the aluminum wiring layer AL1 of the upper most layer. In the same manner, the wirings between the resistors R34 and 35 and the substrate back bias voltage supplying point VBB are formed respectively as the cutting points CP89 and CP90 by the aluminum wiring layer AL1 of the upper most layer.

When the cutting points CP87~CP90 are not cut and the dynamic RAM is in the initial condition, MOSFETQ89 and Q90 are selectively turned ON when a high level test control signal such as the internal power supply voltage VCL is supplied to the corresponding test pads TP1~TP8. In this case, MOSFETQ87 and Q88 are selectively validated when the corresponding MOSFETQ89 or Q90 is turned OFF. Thereby, the deciding level of substrate back bias voltage VBB by the inverter circuit N6 is selectively set. Namely, an output signal of the inverter circuit N6 is selectively set to a low level when MOSFETQ89 and Q90, for example, are turned OFF and MOSFETQ87 and Q88 are validated, since the absolute value of substrate back bias voltage VBB is set smaller than $2 \times V_{thn}$ (here, $V_{thn}$ is a threshold voltage of N-channel MOSFET). Thereby, an inverted output signal VBSB of the level detection circuit LVC is selectively set to a low level. Moreover, when any one, for example, of MOSFETQ89 or Q90 is turned OFF and any one of MOSFETQ87 or Q88 is validated, an output signal of the inverter circuit N6 is selectively set to a low level since an absolute value of substrate back bias voltage VBB is set smaller than $V_{thn}$. Thereby, an Inverted output signal VBSB of the level detection circuit LVC is selectively set to a low level. Namely, when MOSEFET Q89 and Q90 are selectively turned ON or OFF, the decision level for the substrate back bias voltage VBB of the level detection circuit LVC, namely the substrate voltage generating circuit VBBG is selectively trimmed.

An inverted output signal VBSB of the level detection circuit LVC is supplied, although not restricted particularly, to the one input terminal of the NAND gate circuit NA4 of the oscillation circuit OSC. To the other input terminal of this NAND gate circuit NA4, an inverted internal control signal R1B which is set to a low level selectively when the dynamic RAM is selected is supplied. The oscillation circuit OSC includes a so-called ring oscillator connecting the inverter circuit N7 and two NAND gate circuits NA5 and NA6 connected in the form of a ring. An output signal of the NAND gate circuit NA4 is supplied in common to the other input terminal of the NAND gate circuits NA5 and NA6. Thereby, the ring oscillator including the NAND gate circuits NA5 and NA6 is selectively operated to form a pulse signal OSCV of the predetermined frequency when an output signal of the NAND gate circuit NA4 is set to a high level, in other words, an absolute value of substrate back bias voltage VBB becomes smaller than the decision level of the inverter circuit N6 and an inverted output signal VBSB of the level detection circuit LVC is set to a low level, or when the dynamic RAM is selected and an inverted internal control signal R1B is set to a low level.

An output signal of the oscillation circuit OSC, namely a pulse signal OSCV is supplied to the one electrode of a boost capacitor C1 forming a charge pump circuit CP through a drive circuit consisting of four NAND gate circuits and inverter circuit. The other electrode of this boost capacitor C1 is coupled with the ground potential of the circuit through the N-channel MOSFETQ91 connected in the diode mode and is also coupled to the substrate back bias voltage supplying point VBB through the N-channel MOSFETQ92 connected in the diode mode. When the pulse signal OSCV is set to a low level, the one electrode of the boost capacitor C1 is boosted up to a high level such as the internal power supply voltage VCL. This high level is transmitted to the other electrode of the boost capacitor C1 but the potential thereof is limited by $V_{thn}$ with the clamping effect of MOSFETQ91. When the pulse signal OSCV is changed to a high level, the one electrode of the boost capacitor C1 is set to a low level such as the ground potential of the circuit. This low level is transmitted to the other electrode of the boost capacitor C1 and thereby such potential is set to a negative voltage such as $-(VCL-V_{thn})$. A negative potential of the other electrode of the boost capacitor C1 is transmitted to the substrate back bias voltage supplying point VBB through MOSFETQ92. As a result, a value of the substrate back bias voltage VBB is set to a negative value such as $$VBB=-(VCL-2\times V_{thn})$$

It is a matter of course that an absolute value of the preset constant potential of this substrate back bias voltage VBB exceeds a decision level of the level detection circuit LVC. Therefore, when a potential of the substrate back bias voltage VBB has reached the preset potential, operations of the oscillation circuit OSC and charge pump circuit CP are ceased automatically under the condition that the dynamic RAM is not selected.

The substrate back bias voltage VBB is supplied to a P type semiconductor substrate PSUB (e.g., see FIG. 4) to control operation characteristics of MOSFETs in the substrate. The level of the substrate back bias voltage VBB gradually rises when a leak current flows through a semiconductor substrate and thereafter an absolute value thereof becomes smaller than the decision level of the level detection circuit LVC. As a result, an inverted output signal VBSB of the level detection circuit LVC is set again to a low level and operations explained above are repeated. As explained previously, the decision level of the substrate back bias voltage VBB of the level detection circuit, namely the substrate voltage generation circuit VBBG is selectively selected when a high or low level test control signal is supplied to the test pad TP9 or TP10 in the probe test of dynamic RAM in the wafer condition. A wiring correction data for selectively cutting the cutting points CP87 CP90 is generated by the test equipment responsive to such test result and the cutting process based on such wiring correction data is executed by the predetermined wiring correction equipment. As a result, the decision level of the level detection circuit LVC, moreover the substrate voltage generating circuit VBBG is fixed and the trimming thereof is completed.

5. Timing Generation Circuit and Delay Time Trimming System

The dynamic RAM of this embodiment comprises a timing generation circuit TG to form various internal control signals explained above. Although not restricted particularly, a row address strobe signal RASB, a column address strobe signal CASB, a write enable signal WEB and an output enable signal OEB are supplied to the timing generation circuit TG as the start control signal and an internal address signal X8 is also supplied from the X address buffer XAB. The timing generation circuit TG generates various internal control signals based on the start control signals and internal address signal X8 and supplies these signals to each part of the the dynamic RAM. The output enable signal OEB is selectively validated, as will be explained later, when the dynamic RAM has the x4 bits composition.

Figure 25:
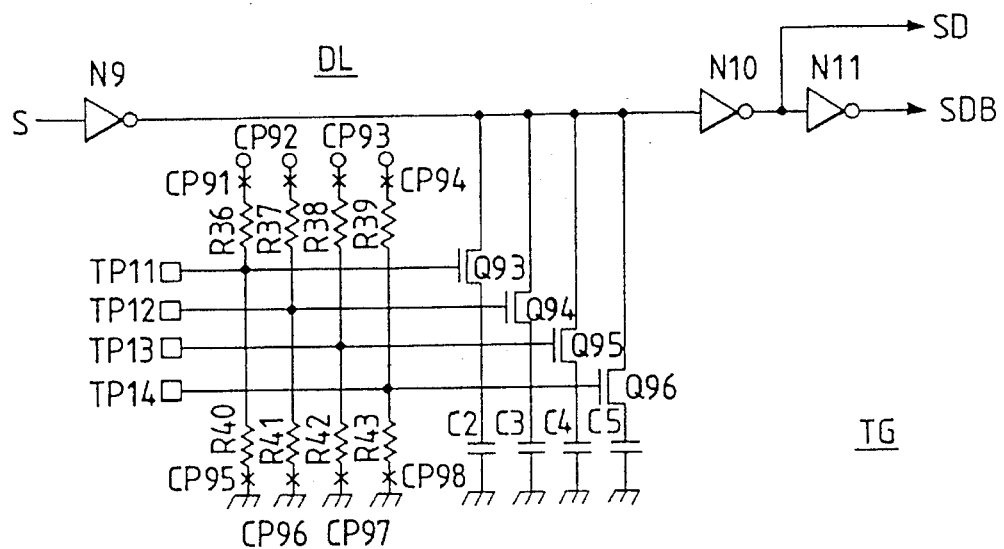
FIG. 25 is a circuit diagram indicating an embodiment of a delay circuit included in a timing generation circuit of the dynamic RAM of FIG. 1.

By the way, the timing generation circuit TG of the dynamic RAM of this embodiment generates, although not restricted particularly, an internal control signal PA for driving the sense amplifier, an internal control signal YDG for driving the Y address decoder and internal control signals MAW and MAR for driving main amplifier and also includes a plurality of delay circuits DL for setting the timing of these internal control signals. In this embodiment, these delay circuits DL as a whole or a part of these delay circuits include, although not restricted particularly, three inverter circuits N9~N11 for transmitting an input signal S as illustrated in FIG. 25. An output signal of the inverter circuit N10 is used as the non-inverted delay signal SD, while an output signal of the inverter circuit N11 is used as the inverted delay signal SDB. Although not restricted particularly, four pairs of series circuits consisting of N-channel MOSFETQ93~Q96 and capacitors C2~C5 are provided in parallel between the output terminal of inverter circuit N9 and the ground potential of the circuit. The gates of MOSFETQ93~Q96 are respectively connected with the corresponding test pads TP11~TP14. Moreover, these gates are also connected to the power supply voltage of the circuit through the corresponding resistors R36~R39 and moreover to the ground potential of the circuit through the corresponding resistors R40~R43. The wirings between the resistors R36~R39 and the power supply voltage of the circuit are respectively formed as the cutting points CP91~CP94 through the aluminum wiring layer AL1 of the upper most layer. In the same manner, the wirings between the resistors R40~R43 and the ground potential of the circuit are formed as the cutting points CP95~CP98 through the aluminum wiring layer AL1 of the upper most layer.

In the initial condition of dynamic RAM wherein the cutting points CP91~CP98 are not cut, MOSFETQ93~Q96 are selectively turned ON when a high level test control signal is supplied to the corresponding test pads TP11~TP14. In this case, the capacitors C2~C5 corresponding to MOSFETQ93~Q96 being turned ON are selectively connected to the output terminal of the inverter circuit N9 and thereby a level change rate of such output signal, namely a delay time for the input signal S of the delay circuit DL is selectively changed. As a result, the rising edge of the internal control signals PA and YDG, MAW and MAR are selectively switched and thereby the drive timing of sense amplifier or Y address decoder or main amplifier is also switched. Setting of these timings is executed on trial, although not restricted particularly, in the probe test of dynamic RAM under the wafer condition and wiring correction data generated based on this test result is transmitted to the wiring correction equipment on the in-line basis. The corresponding cutting points CP91~CP98 are selectively cut and the trimming of drive timing can be completed.

6. Signature Circuit and Discrimination Level Trimming Method

The dynamic RAM of this embodiment comprises, as explained above, four redundant word lines WR0~WR3 and eight pairs of redundant complementary bit lines BR0~BR7 corresponding to the memory arrays ARYL and ARYR and so-called defect saving can be executed by selectively assigning these redundant word lines or redundant complementary bit lines to the defective complementary bit lines. The dynamic RAM of this embodiment is provided with a signature function for discriminating, from outside after completion of a product, that the defect saving by the redundant word lines or redundant complementary bit lines has already been executed and is also provided with a signature circuit SIG for this purpose. In this embodiment, decision for defect saving by the signature circuit SIG is made, although not restricted particularly, by measuring whether a stand-by current of dynamic RAM is changed or not when a high voltage is applied to the data input/output terminal DIO3, namely to the data output terminal $D_{out}$.

Figure 26:
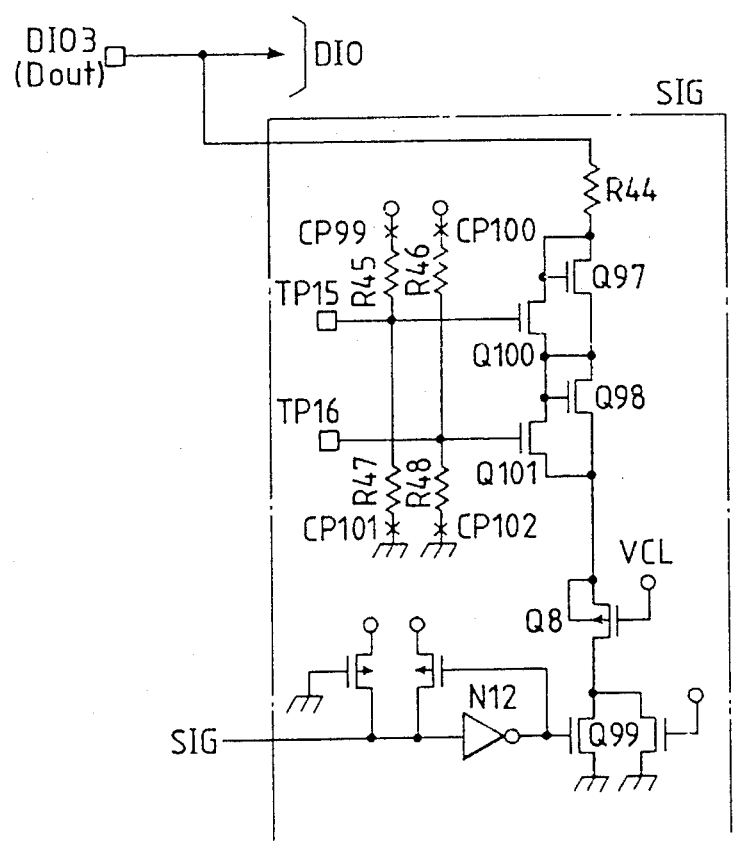
FIG. 26 is a circuit diagram indicating an embodiment of a signature circuit included in the dynamic RAM of FIG. 1.

The signature circuit SIG comprises, although not restricted particularly, a resistor R44, N-channel MOSFETQ97~Q99 and P-channel MOSFETQ8 provided in series between the data input/output terminal DIO3, namely the data output terminal $D_{out}$ and the ground potential of the circuit as shown in FIG. 26. MOSFET Q97 and Q98 are connected in the diode mode because the gates and drains thereof are connected in common and an internal power supply voltage VCL is supplied to the gate of MOSFETQ8. Moreover, an inverted signal by the inverter circuit N12 of the internal control signal SIG formed by taking OR of the redundant switching signals of address decoders is supplied to the gate of MOSFETQ99. The internal control signal SIG is selectively set to a high level as explained above when defect saving by any redundant word line or redundant complementary bit line has been executed. An N-channel MOSFETQ100 is provided between the common-connected gate and drain of MOSFETQ97 and the common-connected gate and drain of MOSFETQ98, while an N-channel MOSFET Q101 is provided between the common-connected gate and drain of MOSFETQ98 and the source of MOSFETQ8. The gates of these MOSFETQ100 and Q101 are respectively connected with the corresponding pads TP15 and TP16. Moreover, these gates are also connected to the power supply voltage of the circuit through the corresponding resistors R45 and R46 and moreover to the ground potential of the circuit through the corresponding resistors R47 and R48. The wirings between the resistors R45 and R46 and the power supply voltage of the circuit are formed as the cutting points CP99 and CP100 by the aluminum wiring layer AL1 of the upper most layer. In the same manner, the wirings between the resistors R47 and R28 and the ground potential of the circuit are formed as the cutting points CP101 and CP102 by the aluminum wiring layer AL1 of the upper most layer.

When the cutting points CP99~CP102 are not cut and the dynamic RAM is in the initial condition, MOSFETQ100 and Q101 are selectively turned ON when a high level test control signal such as internal power supply voltage VCL is supplied to the corresponding test pad TP15 or TP16. In this case, MOSFETQ97 and Q98 are selectively validated when the corresponding MOSFET100 or Q101 is turned OFF. Thereby, the discrimination level of signature circuit SIG is selectively set for a high voltage test control circuit supplied from the data input/output terminal DIO3. Namely, when MOSFETQ100 and Q101, for example, are turned OFF and MOSFETQ97 and Q98 are validated, a current flows selectively between the data input/output terminal DIO3 and the ground potential of the circuit, in case the level of high voltage test control signal supplied from the data input/output terminal DIO3 exceeds $2 \times V_{thn} + V_{thP}$ (here, $V_{thP}$ indicates a threshold voltage of the P-channel MOSFET) and MOSFETQ99 is turned ON, in other words, the defect saving by the redundant word lines or redundant complementary bit lines is not executed and the internal control signal SIG is set to a low level. On the other hand, if, for example, any one of MOSFETQ100 or Q101 is turned ON and any one of MOSFETQ97 or Q98 is validated, a current flows selectively between the data input/output terminal DIO3 and the ground potential of the circuit, in case a level of high voltage test control signal supplied from the data input/output terminal DIO3 exceeds $V_{thn} + V_{thP}$ and the MOSFETQ99 is turned ON. Namely, switching to redundant circuits of the dynamic RAM can be discriminated after it is sealed within a package by measuring change of a stand-by current of the dynamic RAM.

As explained above, the discrimination level of the signature circuit SIG for a high voltage test control signal supplied through the data input/output terminal DIO3 is selectively switched because the high level test control signals are supplied thereto from the test pads TP15 and TP16. This switching is executed on trial, although not restricted particularly, in the probe test of the dynamic RAM under the wafer condition and the wiring correction data generated responsive to this test result is transmitted to the wiring correction equipment on the in-line basis. When the corresponding cutting points CP99~CP101 are selectively cut, the trimming of discrimination level of the signature circuit SIG is completed.

7. Data Input/Output Circuit and Bit Composition Switching System

The dynamic RAM of the present invention comprises, as explained previously, four main amplifier groups MAG0~MAG3 and also a data input/output circuit DIO coupled with such main amplifier groups through the data input signal lines DI0~DI3 and data output signal lines DO0~DO3. In this embodiment, the dynamic RAM selectively has, although not restricted particularly, the x1 bit composition or x4 bits composition as the bit composition by cutting the predetermined wirings through the predetermined combination. In case the dynamic RAM has the x4 bits composition, the write and read data are inputted or outputted in parallel through the data input/output terminals DIO0~DIO3. Moreover, when the dynamic RAM has the x1 bit composition, the write data is inputted, although not restricted particularly, through the data input/output terminal DIO0, namely the data input terminal $D_{in}$ and the read data is outputted through the data input/output terminal DIO3, namely the data output terminal $D_{out}$.

The data input/output circuit DIO comprises, although not restricted particularly, four data input buffers DIB0~DIB3 and data output buffers DOB0~DOB3 provided corresponding to the data input/output terminals DIO0~DIO3. Among these buffers, the input terminals of data input buffers DIB0~DIB3 are coupled respectively to the corresponding data input/output terminals DIO0~DIO3, while the output terminals are respectively coupled with the corresponding data input signal lines DI0~DI3 under the condition that the dynamic RAM has the x4 bits composition. Although not restricted particularly, when the dynamic RAM has the x1 bit composition, the output terminals of data input buffer DIB0 are all substantially connected in common with all data input lines DI0~DI3 and the write signal is transmitted to any one of the memory module selection signals NA0~NA3 for these data input signal lines. Meanwhile, the input terminals of the data output buffers DOB0~DOB3 are respectively connected with the corresponding data output signal lines DO0~DO3, while the output terminals are respectively connected to the corresponding data input/output terminals DIO0~DIO3 under the condition that the dynamic RAM has the x4 bits composition. In case the dynamic RAM has the x1 bit composition, the input terminal of the data output buffer DOB3 is substantially connected in common to all data output signal lines DO0~DO3 and the read signal outputted through these data output signal line is transmitted to the data input/output terminal DIO3 responsive to any one of the memory module selection signals NA0~NA3. When the dynamic RAM has the x1 bit composition, any one of the memory module selection signals NA0~NA3 is set to a high level responsive to the Y address signals AY10 and AY11 of upper two bits and when the dynamic RAM has the x4 bits compsition, such signals are set simultaneously to a high level.

Figure 27:
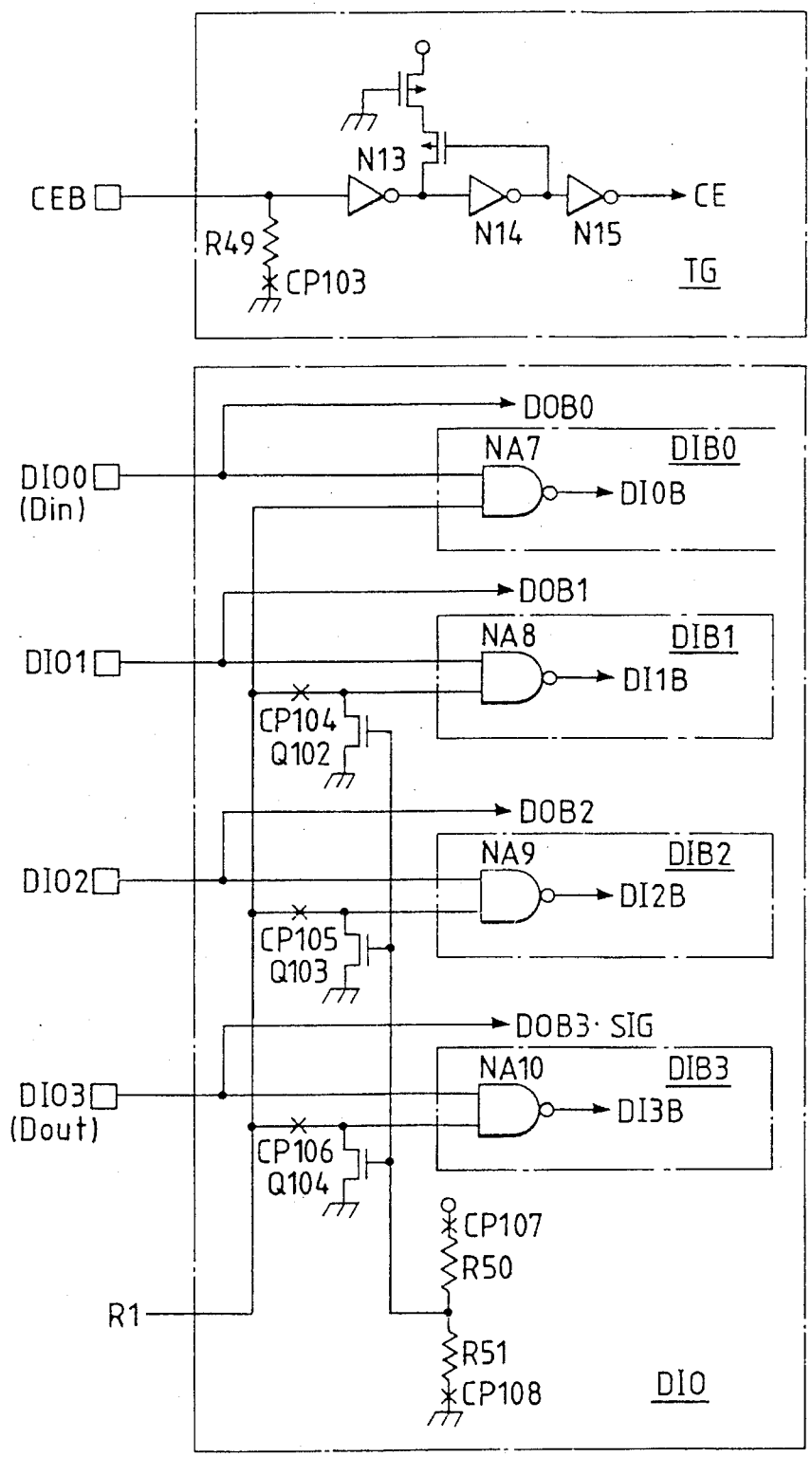
FIG. 27 is a partial circuit diagram indicating an embodiment of a data input/output circuit included in the dynamic RAM of FIG. 1.

By the way, in the data input buffers DIB0~DIB3 of the data input/output circuit DIO, as shown in FIG. 27, the one input terminal includes the NAND gate circuits NA7~NA10 connected to the corresponding data input/output terminals DIO0~DIO3. To the other input terminals of these NAND gate circuits, the internal control signal R1 which is selectively set to a high level in the predetermined timing when the dynamic RAM is selected is supplied in common. Moreover, although not restricted particularly, the N-channel MOSFETQ102~Q104 are respectively provided between the other input terminals of the NAND gate circuits NA8~NA10 forming the data input buffers DIB1~DIB3 and the ground potential of the circuit. The common-connected datas of these MOSFETs are connected to the power supply voltage of the circuit through a resistor R50 and is also connected to the ground potential of the circuit through the resistor R51. The wiring between the resistor R50 and the power supply voltage of the circuit is formed as the cutting point CP107 through the aluminum wiring layer AL1 of the upper most layer. In the same manner, the wiring between the resistor R51 and the ground potential of the circuit is formed as the cutting point CP108 by the aluminum wiring layer AL1 of the upper most layer. Moreover, the wirings between the drains of MOSFETQ102~Q104 and the internal control signal line R1 are formed respectively as the cutting points CP104~CP106 by the aluminum wiring layer AL1 of the upper most layer.

The cutting points CP104~CP108 are selectively cut by the wiring correction equipment in such a stage that the product specification, namely bit composition of dynamic RAM is decided. That is, when the dynamic RAM has the x4 bits composition, the cutting points CP104~CP106 and CP108 are not cut and only the cutting point CP107 is cut.

Accordingly, MOSFETQ102~Q104 are all turned OFF and the internal control signal R1 is transmitted in common to the other input terminals of the NAND gate circuits NA7~NA10 of the data input buffers DIB0~DIB3. As a result, the data input buffers DIB0~DIB3 are all validated to transmit the write data of 4 bits inputted through the data input/output terminals DIO0~DIO3 to the corresponding data input signal lines DI0~DI3. In this timing, in the timing generation circuit TG, although not restricted particularly, the cutting point CP103 provided between the resistor R49 and the ground potential of the circuit is cut as shown in FIG. 27 and the output enable signal OEB is validated.

On the other hand, when the dynamic RAM has the x1 bit composition, the cutting point CP107 is not cut but the cutting points CP104~CP106 and the cutting point CP108 are cut. Therefore, MOSFETQ102~Q104 are all turned ON and the internal control signal R1 is not transmitted to the other input terminals of the NAND gate circuits NA8~NA10 forming the data input buffers DIB1~DIB3. As a result, the data intput buffers DIB1~DIB3 are invalidated and the write data of 1 bit inputted through the data input buffer DIB0 is transmitted in common to the data input signal lines DI0~DI3. In this timing, the cutting point CP103 is not cut in the timing generation circuit TG and the input terminal of the inverter circuit N13 is fixed to a low level through the resistor R49. As a result, the internal control signal CE is fixed to a high level and the dynamic RAM does not require the output enable signal OEB.

8. Wiring Correction Equipment and Process

The dynamic RAM of the present invention is provided, as explained previously, with a plurality of cutting points and selectively realizes DC defect saving, switching to redundant circuits, trimming of operation characteristic or change of product specification. In this embodiment, the wiring correction equipment is basically formed, although not restricted particularly, with an EB (electron beam) direct wiring apparatus of FIB (focused ion beam) apparatus or laser repair apparatus and is connected with a test equipment in the on-line basis.

8.1 Wiring Correction Equipment

Figure 28:
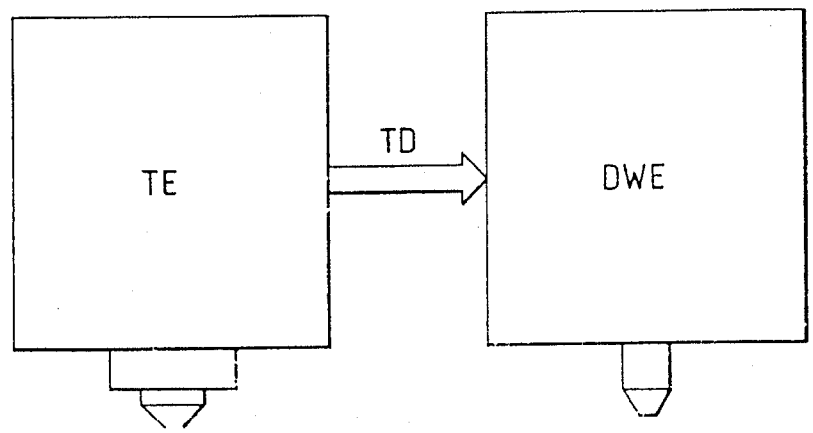
FIG. 28 is a performance comparison diagram showing an embodiment of a wiring correction equipment to be used for wiring correction of the dynamic RAM of FIG. 1.

In FIG. 28, the performance of EB direct wiring apparatus, FIB apparatus and laser repair apparatus forming the wiring correction equipment of this embodiment is compared respectively. In regard to this comparison, the EB direct writing apparatus disconnects or connects the predetermined wirings through direct elimination of resist, for example, coated on chips by controlling the travelling direction of an EB (Electron Beam) generated, accelerated and focused by an electron gun with a deflection system utilizing electromagnetic or electrostatic deflection. The EB direct writing apparatus is capable of extremely reducing a beam diameter by utilizing the electron beam and has sufficiently high resolution. The controller thereof comprises a central processing unit CPU and can be connected by the on-line system with the test equipment for the probe test in the production process of dynamic RAM.

Meanwhile, the FIB apparatus realizes cutting of wirings by sputter etching through scanning of FIB (Focused Ion Beam) generated, for example, by gallium metal ion source, namely the high performance focused ion beam and connection of wirings by FIB CVD (Chemical Vapor Deposition). This FIB apparatus has the high resolution next to the EB direct wiring apparatus. Moreover, similar to the EB direct writing apparatus, it comprises the controller consisting of central processing unit CPU and can be connected with the test equipment by the on-line system in the production process of dynamic RAM.

Moreover, the laser repair apparatus disconnects polysilicon, etc. formed on chips by controlling deflection of laser beam generated, for example, by a semiconductor laser exciting medium. This apparatus is not suitable for connection of metal wiring layers having a large reflectivity and new wirings but realizes cutting process with a low accuracy with comparatively low cost. Similar to the EB direct writing apparatus and FIB apparatus, it also comprises the controller consisting of central processing unit CPU and can be connected with the test equipment by the on-line basis in the production process of dynamic RAM.

8.2 Connection between wiring correction equipment and Test Equipment

Figure 29:
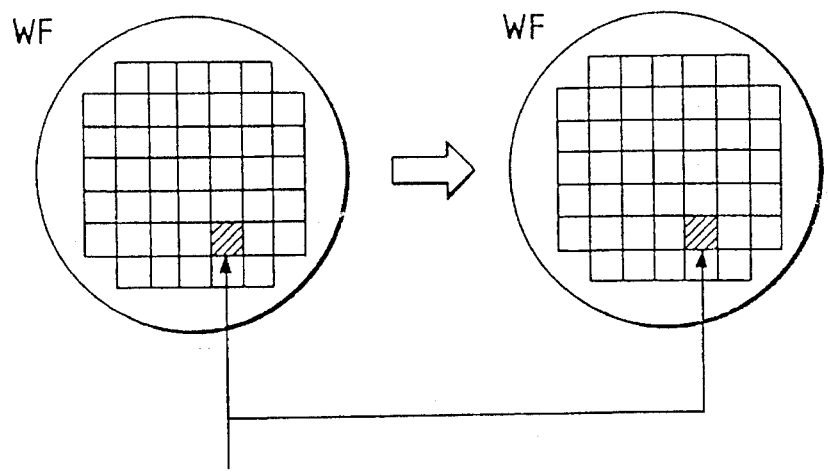
FIG. 29 is a connecting diagram indicating an embodiment of the wiring correction equipment and the test equipment of FIG. 28.

FIG. 29 illustrates a connecting diagram of en embodiment between the wiring correction equipment and test equipment in this embodiment. This figure shows a part of the process for producing a dynamic RAM and the wiring correction equipment DWE and test equipment TE are connected by the on-line basis in this production process.

In FIG. 29, the test equipment TE employs, although not restricted particularly, a stored program system and executes the function test of a plurality of dynamic RAMs formed on a wafer under the wafer condition through a probe. With this function test, performance and operating characteristic of a dynamic RAM are decided and defects of word lines or complementary bit lines forming a memory array can be detected. The test equipment TE determines the trimming conditions for setting level and timing and assigns the redundant word lines or redundant complementary bit lines responsive to the result of such test. Thereafter, the wiring correction data TD regarding a plurality of cutting points prepared for dynamic RAM is generated and it is then transferred by on-line to the wiring correction equipment DWE. The wiring correction data for such cutting points may also be generated within the wiring correction equipment DWE based on the test result obtained by the test equipment TE.

The wiring correction equipment DWE disconnects a plurality of cutting points provided in the dynamic RAM on the wafer WF through a combination responsive to the wiring correction data TD supplied from the test equipment TE. The wiring correction equipment DWE also comprises a storage apparatus for storing the corresponding wiring correction data while the wafer WF to be subjected to the wiring correction is moved from the test equipment TE. In this embodiment, each cutting point of dynamic RAM is completely formed by the aluminum wiring layer AL1 of the upper most layer or a part of the cutting point is connected at least at each cutting point through the aluminum wiring layer LA1 of the upper most layer. The wiring correction equipment DWE may have the function to connect new wirings and may execute a so-called batch process for the wiring correction data obtained by the test equipment TE.

8.3 Process

Figure 30:
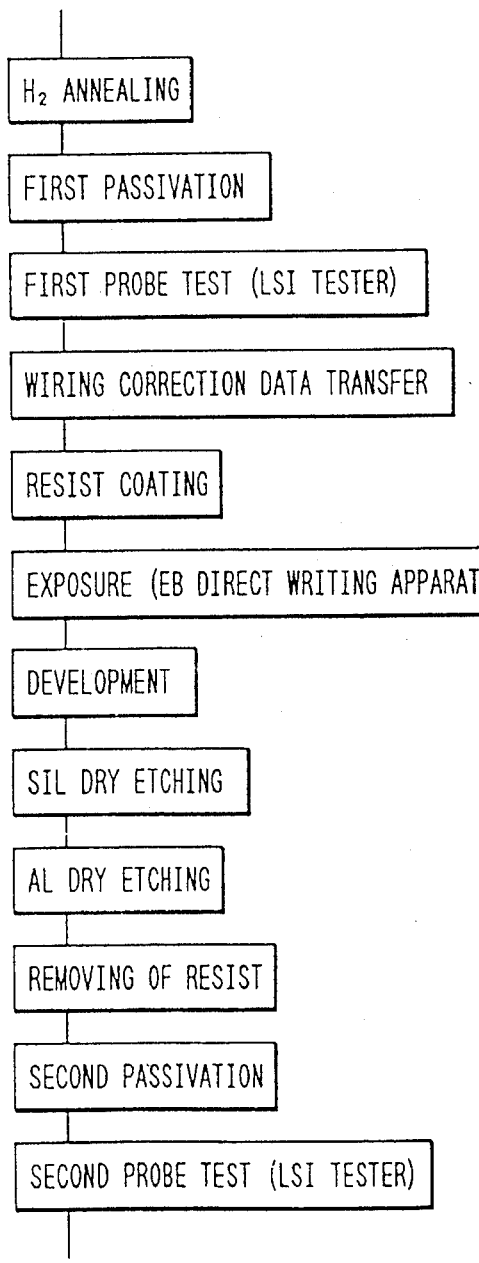
FIG. 30 is a partial process diagram indicating an embodiment in such a case that the wiring correction equipment is basically formed by an EB direct writing apparatus.
Figure 31:
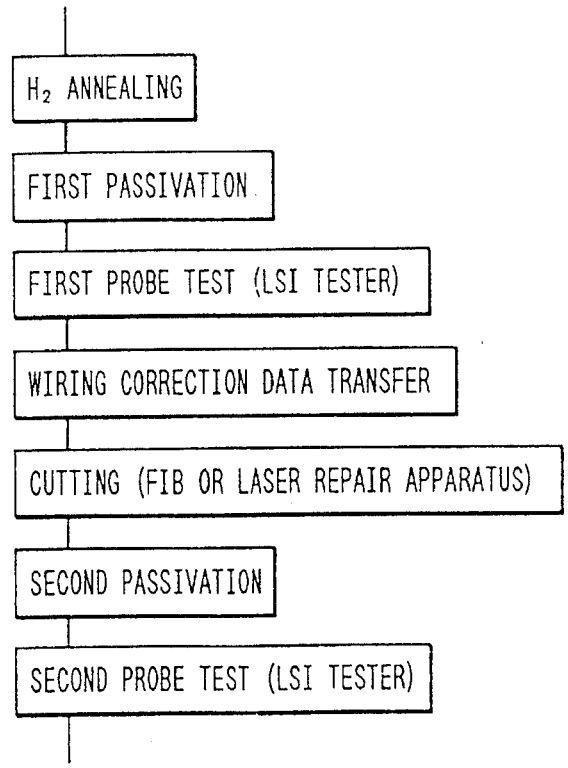
FIG. 31 is a partial process diagram indicating an embodiment in such a case that the wiring correction equipment is basically formed by an FIB apparatus or laser repair apparatus.

FIG. 30 illustrates a partial process of an embodiment in such a case that the wiring correction equipment of this embodiment is formed basically by an EB direct writing apparatus. Moreover, FIG. 31 illustrates a partial process of an embodiment in such a case that the wiring correction equipment of this embodiment is basically formed by an FIB apparatus or laser repair apparatus. From these figures, outline of process for cutting of wirings by the wiring correction equipment will be explained hereunder.

In FIG. 30, a wafer which has completed a series of pattern forming process to form a dynamic RAM on a semiconductor substrate is first annealed, although not restricted particularly, at a temperature, for example, of about 400° C. under the $H_2$ (hydrogen) atmosphere in order to have resistivity to process damage. Moreover, only a bonding pad or test pad is opened and first passivation is executed and thereby a protection layer in the thickness of about 2000 Å is formed as the preparation for the probe test. Under this condition, the probe test is executed with the test equipment, namely an LSI tester and the wiring correction data generated based on this test result is transmitted to the wiring correction equipment from the test equipment by the on-line basis. Next, the resist coating process is executed to the wafer. For example, the wafer is coated with resist (photosensitive agent) consisting of novolac group resin material. This resist is developed after it is directly exposed by an electron beam generated from the EB direct writing apparatus. In this timing, the cutting points of each dynamic RAM are exposed and the silane (SiL) protection layer and the aluminum wiring layer AL1 of the upper most layer corresponding to these cutting points are cut by the next SiL dry etching and AL dry etching. Finally, the resist on the wafer is removed. After the second passivation is executed, the probe test by LSI tester is executed again to check the function and performance of the dynamic RAM.

On the other hand, in case the wiring correction equipment is basically formed by an FIB apparatus or laser repair apparatus, the protection layer and aluminum wiring layer AL1 of the upper most layer of the part corresponding to the cutting points of the dynamic RAM are cut directly by the ion beam generated by the FIB apparatus or laser beam generated by laser repair apparatus, responsive to the wiring correction data transferred from the test equipment, namely a LSI tester. Thereafter, the probe test by the LSI tester is executed after the second passivation to check the performance and function of the dynamic RAM.

As indicated in the embodiment, the following operational effects may be obtained by applying the present invention to a semiconductor integrated circuit device such as a dynamic RAM having the defect saving function and its wiring correction equipment. Namely, (1) The effect of efficiently changing the internal mode of dynamic RAM can be attained by executing the probe test of chip forming dynamic RAM, etc. with the predetermined test equipment under the wafer condition, transferring the test result to the wiring correction equipment basically formed by the EB direct writing apparatus or FIB apparatus or laser repair apparatus as the wiring correction data, and cutting or connecting directly or indirectly the corresponding wirings formed on the chip responsive to these wiring correction data.

(2) The effect of further reducing the number of test procedures in the production process of dynamic RAM can attained by coupling the test equipment and wiring correction equipment by the on-line basis in the item (1).

(3) The effect of efficiently realizing wiring correction by the wiring correction equipment can be attained by totally or partly forming the wirings to be cut or connected through the metal wiring layer of the upper most layer in the item (1).

(4) The effect of saving DC defects after switching to the redundant circuit of a dynamic RAM and remarkably enhancing the product yield can be attained by introducing wiring correction of the items (1) to (3) for cutting of a leak current path through the defective element or circuit replaced with the redundant element or circuit.

(5) The effect of efficiently realizing switching to the redundant circuit without deteriorating high speed operation and a remarkable increase of chip area of a dynamic RAM can be obtained by introducing the wiring correction of the items (1) to (3) to so-called switching to a redundant circuit by a decoder in which a defective element or circuit is replaced with a redundant element or circuit by direct switching of the logical conditions of an address decoder.

(6) The effect of a substantial reduction of layout pitch of fuse means and reduction of chip area of a dynamic RAM introducing switching to a redundant circuit through comparison and collation of addresses can be obtained by introducing the wiring correction of items (1) to (3) into cutting of fuse means provided in a defective address ROM.

(7) The effect of realizing low power consumption of a partial product can be obtained by introducing the wiring correction of items (1) to (3) into cutting of a current path formed through the other defective part of a partial product such as a dynamic RAM formed by utilizing the normal part of the internal circuit.

(8) The effect of efficiently changing operation characteristic of a dynamic RAM, etc. and realizing the trimming can obtained by introducing the wiring correction of items (1) to (3) into level setting of the internal power supply voltage generated by a voltage step-down circuit, level setting of a substrate back bias voltage generated by a substrate voltage generating ciricuit, timing setting of internal control signals generated by a timing generation circuit and discrimination level setting for test control voltage of a signature circuit.

(9) The effect of efficiently switching the product specification of a dynamic RAM, etc. can be obtained by introducing the wiring correction of items (1) to (3) into change of product specification such as bit composition, etc.

(10) The effect of promoting low cost and low power counsumption can be obtained by reducing chip area, operating current and test procedures without deteriorating high speed operation characteristics of a dynamic RAM in accordance with the items (1) to (3).

Although the present invention has been described with reference to the preferred embodiment thereof, but the present invention is not limited thereto and allows various changes and modifications within the scope of the claims. For instance, the block composition of a dynamic RAM can employ various profiles in FIG. 1 and FIG. 2 and the storing capacity thereof, namely the number of bits of an address signal and nomenclatures and combinations of the start control signal and an internal control signal are not restricted by this preferred embodiment. Moreover, a unit of forming a partial product can be set freely and is combined also freely. A dynamic RAM is not required to employ the shared sense system and its bit composition can be introduced freely, for example, x8 or x16 bits composition, etc. In FIG. 7, the cutting points for realizing DC defect saving can be added or reduced as required and each cutting point may be formed, for example, through the aluminum wiring layer of the second layer or lower layer or the wiring layer of the different type. A device composition in each cutting point and a practical method for realizing cutting and connection of wirings may be considered variously. In FIG. 16, cutting for separating defective parts of a partial product may be substantially limited only to minimum wirings forming a current path and the aluminum wiring layer of the upper most layer formed in the periphery of the memory array or memory mat or memory module to be cut, on the contrary, may be cut completely without any conditions. In FIG. 17 to FIG. 19, the logical composition for selecting redundant word lines or redundant complementary bit lines is not restricted by these embodiments. Moreover, the number of redundant word lines or redundant complementary bit lines provided in each memory array can also be set freely. In FIG. 23 to FIG. 26, the number of test pads provided in each trimming circuit, namely accuracy and range of trimming can be set freely and various practical methods of trimming can also be employed. In FIG. 27, various methods can also be introduced for changing the bit composition of a dynamic RAM and the input/output level and operation mode, for example, of a dynamic RAM can be changed with similar method. In FIG. 28, the wiring correction equipment may be formed basically by an apparatus other than EB direct wiring apparatus, FIB apparatus and laser repair apparatus and the process shown in FIG. 30 and FIG. 31 does not give any restriction to reinforcement of the present invention. In addition, various profiles may also be applied to practical circuit compositions indicated in the circuit diagrams, conductivity type of MOSFETs and voltage and polarity of various power supply voltages.

In the above explanation, the present invention has been applied to a dynamic RAM which is the application field thereof, but the present Invention is not limited thereto. For instance, the present invention can also be applied to various semiconducter storage devices such as multi-port RAMs and static RAMs and to general purpose or exclusive logic integrated circuit such as gate array integrated circuits. The present invention can widely be applied to a semiconductor integrated circuit device comprising at least redundant elements or circuits or a semiconductor integrated circuit device which requires and provides the wiring correction for trimming as the effective means.

The function test of a chip forming dynamic RAM, etc. is executed under the wafer condition by the predetermined test equipment, and the result of a test is transferred as wiring correction data by the on-line basis to a wiring correction equipment basically formed by an EB direct writing apparatus or FIB apparatus or laser repair apparatus. The defective element or circuit is replaced with a redundant element or circuit and the current path formed through this defective element or circuit is cut by directly or indirectly cutting or connecting the corresponding wirings on the chip responsive to such wiring correction data. Moreover, cutting and connection of such wirings are applied for separation of a defective part forming a partial product and change of operation characteristics or product specifications of the predetermined internal circuit. Thereby, the defective element or circuit may be replaced with a redundant element or circuit, the defective element or circuit replaced with a redundant element or circuit is easily separated and current path formed through a defective element or circuit can be cut without increase of the required layout area by sacrificing the access time of the dynamic RAM. Moreover, a defective part of the dynamic RAM forming a partial product may easily be separated and low power consumption can be accelerated and operation characteristic of the internal circuit and product specifications of the dynamic RAM can be changed without providing a fuse means. As a result, chip area, operation current and the number of test procedures may be reduced without deteriorating high speed characteristics of the dynamic RAM comprising the defect saving function, and thereby cost reduction can further be accelerated, DC defects after switching to the redundant circuit can be saved and product yield can remarkably be enhanced.

We claim:

1. A method of saving a defective semiconductor memory having a plurality of bit lines, a redundant bit line and a plurality of MOSFETs coupled to said plurality of bit lines and said redundant bit line, respectively, comprising the steps of:

(a) forming a voltage supply line, on a semiconductor substrate, which is capable of providing said plurality of bit lines and a redundant bit line with a voltage through said plurality of MOSFETs, respectively;

(b) testing said defective semiconductor memory to locate a defective bit line in said plurality of bit lines;

(c) selecting said redundant bit line instead of said defective bit line; and (d) cutting said voltage supply line at a predetermined place so that said voltage supply line is incapable of providing said defective bit line with said voltage through the corresponding MOSFET.

2. A method according to claim 1, further comprising:

(e) setting address information of said defective bit line into a memory circuit formed in said defective semiconductor memory.

3. A method according to claim 2, wherein said step (e) includes:

(e1) cutting a fuse element in said memory circuit, wherein cutting said fuse element is performed in the same process as cutting said voltage supply line.

4. A method of saving a defective semiconductor memory having a plurality of bit lines, a redundant bit line and a plurality of precharge circuits coupled to said plurality of bit lines and said redundant bit line, respectively, comprising the steps of:

(a) forming a precharge voltage supply line, on a semiconductor substrate, which is capable of providing said plurality of bit lines and a redundant bit line with a precharge voltage through said plurality of precharge circuits, respectively;

(b) testing said defective semiconductor memory to locate a defective bit line in said plurality of bit lines;

(c) selecting said redundant bit line instead of said defective bit line; and (d) cutting said precharge voltage supply line at a predetermined place so that said precharge voltage supply line is incapable of providing said defective bit line with said precharge voltage.

5. A method according to claim 4, further comprising:

(e) setting address information of said defective bit line into a memory circuit formed in said defective semiconductor memory.

6. A method according to claim 5, wherein said step (e) includes:

(e1) cutting a fuse element in said memory circuit, wherein cutting of said fuse element is performed in the same process as cutting said precharge voltage supply line.

7. A method of saving a defective semiconductor memory having a plurality of bit lines, a redundant bit line and a plurality of sense amplifiers coupled to said plurality of bit lines and said redundant bit line, respectively, comprising the steps of:

(a) forming a power supply line, on a semiconductor substrate, which is capable of providing said plurality of sense amplifiers with an operation voltage;

(b) testing said defective semiconductor memory to locate a defective bit line in said plurality of bit lines;

(c) cutting said power supply line at a predetermined place so that said power supply line is incapable of providing the sense amplifier corresponding to said defective bit line with said operation voltage.

8. A method according to claim 7, further comprising:

(e) setting address information of said defective bit line into a memory circuit formed in said defective semiconductor memory.

9. A method according to claim 8, wherein said step (e) includes:

(e1) cutting a fuse element in said memory circuit, wherein cutting of said fuse element is performed in the same process as cutting said power supply line.

10. A semiconductor memory comprising:

a plurality of bit lines;

a redundant bit line to be selected instead of a predetermined one of said bit lines if it is determined that said predetermined one of said bit lines is defective;

a plurality of first precharge circuits coupled to said plurality of bit lines, respectively;

a second precharge circuit coupled to said redundant bit line;

a common control line coupled to said plurality of first precharge circuits, and said second precharge circuit; and a precharge voltage supply line coupled to said plurality of first precharge circuits and said second precharge circuit;

wherein a predetermined one of said first precharge circuits coupled to said defective bit line is placed in a state of being non-coupled to said precharge voltage supply line by cutting said precharge voltage supply line at a predetermined place so that said predetermined one of said first precharge circuits is substantially inoperative thereby preventing voltage from being provided to said defective bit line.

11. A semiconductor memory according to claim 10, wherein said plurality of first precharge circuits and said third precharge circuit are driven by control signals of said common control line.

12. A semiconductor memory comprising:

a plurality of bit lines;

a redundant bit line to be selected instead of a predetermined one of said bit lines if it is determined that said predetermined one of said bit lines is defective;

a plurality of first sense amplifiers coupled to said plurality of bit lines, respectively;

a second sense amplifier coupled to said redundant bit line; and a power supply line coupled to said plurality of first sense amplifiers and said second sense amplifier;

wherein a predetermined one of said first sense amplifiers coupled to said defective bit line is in a state of being non-coupled to said power supply line by cutting said power supply line at a predetermined place so that said predetermined one of said first sense amplifiers is inoperative, thereby preventing voltage from being provided to said defective bit line.

13. A semiconductor memory according to claim 12, wherein said cutting power supply line prevents leakage current from flowing from said power supply line toward a ground line through said defective bit line.

* * * * *